United States Patent
Oyamada

(10) Patent No.: US 9,627,354 B1
(45) Date of Patent: Apr. 18, 2017

(54) SEMICONDUCTOR MEMORY DEVICE

(71) Applicant: Noda Screen Co., Ltd., Aichi (JP)

(72) Inventor: Seisei Oyamada, Komaki (JP)

(73) Assignee: NODA SCREEN CO., LTD., Aichi (JP)

( * ) Notice: Subject to any disclaimer, the term of this patent is extended or adjusted under 35 U.S.C. 154(b) by 80 days.

(21) Appl. No.: 14/779,084

(22) PCT Filed: Jun. 2, 2015

(86) PCT No.: PCT/JP2015/065898
§ 371 (c)(1),
(2) Date: Sep. 22, 2015

(87) PCT Pub. No.: WO2016/194132
PCT Pub. Date: Dec. 8, 2016

(51) Int. Cl.
*H01L 23/34* (2006.01)
*H01L 23/48* (2006.01)
(Continued)

(52) U.S. Cl.
CPC ....... *H01L 25/0652* (2013.01); *H01G 4/1227* (2013.01); *H01G 4/33* (2013.01);
(Continued)

(58) Field of Classification Search
CPC ... H01L 23/3735; H01L 23/642; H01L 23/50; H01L 23/5223; H01L 24/49
See application file for complete search history.

(56) References Cited

U.S. PATENT DOCUMENTS 6,583,511 B2  6/2003 Michii et al.
6,621,155 B1 * 9/2003 Perino ................ H01L 23/3128
                                                          257/528
(Continued)

FOREIGN PATENT DOCUMENTS

JP           60-1691       1/1985
JP        2002-343932    11/2002
(Continued)

OTHER PUBLICATIONS

Written Opinion of the International Searching Authority issued Jul. 14, 2015 in International (PCT) Application No. PCT/JP2015/065898 with English translation.

*Primary Examiner* — Cuong Q Nguyen
(74) *Attorney, Agent, or Firm* — Wenderoth, Lind & Ponack, L.L.P.

(57) ABSTRACT

A semiconductor memory device includes a thin-film capacitor disposed at a position facing a circuit surface of a memory chip except for a center pad region. The thin-film capacitor includes a first plane electrode, a thin-film dielectric layer, and a second plane electrode. The first plane electrode includes a first power supply input portion to which a power supply voltage of one polarity is provided, and a first power supply output portion disposed near the center pad region to output the power supply voltage of one polarity to a center pad. The second plane electrode is formed on the dielectric layer and includes a second power supply input portion to which the power supply voltage of the other polarity is provided, and a second power supply output portion disposed near the center pad region to apply the power supply voltage of the other polarity to the center pad.

11 Claims, 18 Drawing Sheets

(51) Int. Cl.
*H01L 25/065* (2006.01)
*H01L 23/66* (2006.01)
*H01G 4/33* (2006.01)
*H01G 4/12* (2006.01)
*H01L 23/373* (2006.01)
*H01L 23/00* (2006.01)
*H01L 21/56* (2006.01)
*H01G 4/40* (2006.01)

(52) U.S. Cl.
CPC .............. *H01G 4/40* (2013.01); *H01L 21/565* (2013.01); *H01L 23/3735* (2013.01); *H01L 23/66* (2013.01); *H01L 24/49* (2013.01); *H01L 24/85* (2013.01); *H01L 2223/6611* (2013.01); *H01L 2224/45124* (2013.01); *H01L 2224/45144* (2013.01); *H01L 2224/45147* (2013.01); *H01L 2224/48091* (2013.01); *H01L 2224/48106* (2013.01); *H01L 2224/48227* (2013.01); *H01L 2225/0651* (2013.01); *H01L 2225/0652* (2013.01); *H01L 2225/06572* (2013.01); *H01L 2225/06589* (2013.01); *H01L 2924/14361* (2013.01); *H01L 2924/19041* (2013.01); *H01L 2924/19104* (2013.01); *H01L 2924/19107* (2013.01)

(56) References Cited

U.S. PATENT DOCUMENTS

| | | | |
|---|---|---|---|
| 7,511,299 B1 * | 3/2009 | Alexander | .............. H01L 22/32 257/48 |
| 2002/0173076 A1 | 11/2002 | Michii et al. | |
| 2003/0165051 A1 * | 9/2003 | Kledzik | .............. H01L 25/0652 257/E25.011 |
| 2009/0057860 A1 | 3/2009 | Bae et al. | |

FOREIGN PATENT DOCUMENTS

| | | |
|---|---|---|
| JP | 2007-266182 | 10/2007 |
| JP | 2009-055040 | 3/2009 |

* cited by examiner

SEMICONDUCTOR MEMORY DEVICE

TECHNICAL FIELD

The present invention relates to a semiconductor memory device, and more particularly to a semiconductor memory device provided with a thin-film bypass capacitor.

BACKGROUND

As a semiconductor memory device provided with a film bypass capacitor, a technique disclosed in Patent Document 1 has been known, for example. In Patent Document 1, a memory chip includes center pads, where the center pads and substrate wiring formed on a surface of the substrate on the opposite side to the mounting surface are connected by wire bonding via an opening portion formed on the mounting substrate. In this connection structure of the memory chip, thin-film decoupling capacitors (thin-film bypass capacitors) are formed in a region adjacent to the memory chip. Thus, Patent Document 1 discloses a technique that aims at minimizing the parasitic inductance due to electrode structure by forming the thin-film bypass capacitors in the region adjacent to the memory chip.

Patent Document 1: Japanese Unexamined Patent Publication No. 2009-55040

In recent years, however, the clock frequency of semiconductor memory devices is as high as 400 MHz or higher, and the data bit width is also increased. As a result, there are increasing demands for the stability of a power supply voltage and the noise reduction during multi-bit I/O interface in a semiconductor memory device.

In the memory chip including the center pads, the center pads and an external circuit are connected by wire bonding via the opening portion on the mounting substrate. In the case of the bypass capacitors (on the order of the parasitic capacity between electrodes), at the periphery of the opening portion, including a thin-film layer of an amorphous metal oxide film formed on one side of an organic substrate constituting a package, the density of capacitance that can be formed on the organic substrate is extremely low. Accordingly, when the memory performs a multi-bit write or read at high speed, a problem arises that required charges cannot be sufficiently supplied at a close distance.

In the present description, there is disclosed a semiconductor memory device with a memory chip including a center pad, the semiconductor memory device improving an effect of reducing the power supply noise in a high-frequency interface and eliminating the need for an opening portion for external connection on a substrate on which a memory chip is mounted.

SUMMARY

A semiconductor memory device disclosed by the present description is a semiconductor memory device provided with a memory chip including a circuit surface having a center pad region with a plurality of center pads formed therein, and a back surface on a side opposite from the circuit surface, the semiconductor memory device including: a thin-film capacitor disposed at a position facing the circuit surface except for the center pad region; and a first insulating layer formed on a side opposite from the memory chip with respect to the thin-film capacitor, the first insulating layer having a transmission line formed thereon. The thin-film capacitor includes: a first plane electrode including a first power supply input portion to which a power supply voltage of one polarity to the memory chip is supplied, and a first power supply output portion disposed near the center pad region to output the supplied power supply voltage of one polarity to the center pad; a thin-film dielectric layer of a paraelectric material or a ferroelectric material formed on the first plane electrode except for the first power supply input portion and the first power supply output portion; and a second plane electrode formed on the thin-film dielectric layer, the second plane electrode including a second power supply input portion to which a power supply voltage of another polarity to the memory chip is supplied, and a second power supply output portion disposed near the center pad region to apply the supplied power supply voltage of the other polarity to the center pads. The transmission line includes a signal input portion to which a signal to the memory chip is supplied, and a signal output portion disposed near the center pad region to supply the supplied signal to the center pads.

According to this configuration, the thin-film capacitor is disposed at a position facing the circuit surface of the memory chip except for the center pad region. The first plane electrode and the second plane electrode of the thin-film capacitor are provided with the power supply output portions for applying the power supply voltage to the center pads. The transmission line is provided with the signal output portion for applying a signal such as an address signal to the center pads.

Accordingly, in the semiconductor memory device provided with the memory chip including the center pads, an environment can be provided where an insulating layer of a paraelectric material or high-dielectric material and having a high capacitance density is formed at a close distance from the center pads and where the power supply system can be supplied with sufficient charges in a high frequency region of several GHz or higher. A semiconductor memory device, which lowers the power supply impedance at high frequency, increases the power supply noise reducing effect, and does not require an opening portion for external connection on the substrate on which the memory chip is mounted, can be provided.

The semiconductor memory device may include: a substrate on which the memory chip is mounted face-up; and a second insulating layer formed on the circuit surface of the memory chip. The first plane electrode of the thin-film capacitor may be formed on the second insulating layer. The first insulating layer may be formed on the second plane electrode except for the second power supply input portion and the second power supply output portion. The substrate may include a plurality of connecting pads connected to the first power supply input portion, the second power supply input portion, and the signal input portion. The first power supply input portion, the second power supply input portion, and the signal input portion may be connected to the plurality of connecting pads by wire bonding. The first power supply output portion, the second power supply output portion, and the signal output portion may be connected to the plurality of center pads by wire bonding.

According to this configuration, the thin-film capacitor and the transmission line can be connected to the substrate, and the thin-film capacitor and the transmission line can be connected to the center pads of the memory chip, respectively by well-known wire bonding. In this case, the substrate on which the memory chip is mounted does not require an opening portion for external connection.

The semiconductor memory device may include a second insulating layer formed on the circuit surface of the memory chip. The first plane electrode of the thin-film capacitor may be formed on the second insulating layer. The first insulating layer may be formed on the second plane electrode except for the second power supply input portion and the second power supply output portion. The first power supply input portion and the second power supply input portion may include a first connecting bump. The signal input portion may include a second connecting bump having a height smaller than the first connecting bump by a thickness of the first insulating layer. The first power supply output portion, the second power supply output portion, and the signal output portion may be connected to the plurality of center pads by wire bonding.

According to this configuration, a semiconductor memory device that improves the effect of reducing power supply noise in a high-frequency interface and that does not require an opening portion for external connection on the substrate on which the memory chip is mounted can be provided as a CSP (Chip Scale Package) having a BGA (Ball Grid Array).

The semiconductor memory device may include: a metal plate on which the memory chip is mounted face-up; a substrate on which the metal plate is disposed; a second insulating layer formed on the circuit surface of the memory chip; and a protection layer formed on the first insulating layer. The first plane electrode of the thin-film capacitor may be formed on the second insulating layer. The first insulating layer may be formed on the second plane electrode except for the second power supply input portion and the second power supply output portion. The substrate may include a plurality of connecting pads connected to the first power supply input portion, the second power supply input portion, and the signal input portion. The first power supply input portion, the second power supply input portion, and the signal input portion may be connected to the plurality of connecting pads by wire bonding. The first power supply output portion, the second power supply output portion, and the signal output portion may be connected to the plurality of center pads by wire bonding. The substrate, the memory chip, the second insulating layer, the thin-film capacitor, the first insulating layer, and the protection layer may be stacked in this order to form a storage unit. The semiconductor memory device may include at least two tiers of the stacked storage units, and a heat-dissipating member disposed on the protection layer of the uppermost-tier storage unit and thermally connected to each metal plate.

According to this configuration, in the semiconductor memory device formed from a plurality of tiers of storage units including memory chips, the effect of reducing power supply noise in a high-frequency interface can be improved, and the need for an opening portion for external connection on the substrate on which the memory chip is mounted can be eliminated. Further, the heat generated by the memory chips can be dissipated in a preferable manner. Thus, the operational reliability of the semiconductor memory device can be increased.

In the semiconductor memory device, the metal plate may have a rectangular shape having a length smaller than a length of the memory chip in a direction along a wire-laid direction for the wire bonding in a planar view, and a length greater than the length of the memory chip in a direction orthogonal to the wire-laid direction. The metal plate disposed on the lowermost-tier substrate may include a heat-transmitting portion disposed at an end in a longitudinal direction of the metal plate and thermally connected to the heat-dissipating member and the metal plate disposed on the substrate of an upper tier than the lowermost-tier.

According to this configuration, the heat generated from the storage unit of each tier can be transmitted to the heat-dissipating member via the heat-transmitting portion and dissipated via the heat-dissipating member.

Further, in the semiconductor memory device, the substrate may be provided with an opening or a thin-wall portion for disposing the metal plate.

According to this configuration, the metal plate can be readily disposed on the substrate.

The semiconductor memory device may include: a substrate on which the memory chip is mounted face-down; a protection layer formed on the transmission line; and a second insulating layer disposed on the circuit surface of the memory chip. The first plane electrode of the thin-film capacitor may be formed on the second insulating layer. The first insulating layer on a center pad side may be formed on the thin-film capacitor with the first power supply output portion and the second power supply output portion being exposed, while the first insulating layer on an opposite side from the center pad side may be etched back such that the signal input portion is exposed on the protection layer. The second insulating layer on the opposite side from the center pad side may be etched back such that the first power supply input portion and the second power supply input portion are exposed on the first insulating layer. The protection layer on the center pad side may be formed such that the signal output portion is exposed on the second insulating layer, while the protection layer on the opposite side from the center pad side may be formed such that the signal input portion is exposed thereon. The first power supply output portion, the second power supply output portion, and the signal output portion may be connected to the plurality of center pads by wire bonding. The second insulating layer, the thin-film capacitor, the first insulating layer, the transmission line, and the protection layer that are formed on the circuit surface of the memory chip may be mounted on the substrate to be vertically inverted such that the memory chip is provided as the uppermost-layer and the protection layer is provided as the lowermost-layer. The substrate may include a plurality of connecting pads connected to the first power supply input portion, the second power supply input portion, and the signal input portion.

The first power supply input portion, the second power supply input portion, and the signal input portion may be connected to the plurality of connecting pads by wire bonding.

According to this configuration, in the semiconductor memory device provided such that the memory chip is mounted face-down on the substrate, the effect of reducing power supply noise in a high-frequency interface can be improved, and the need for an opening portion for external connection on the substrate can be eliminated. Further, in this configuration, the back surface of the memory chip can be exposed, and thus a heat-dissipating member such as a heat spreader can be provided on the back surface of the memory chip.

The semiconductor memory device may include: a substrate; the first insulating layer formed on the substrate; a second insulating layer formed on the first insulating layer; and a protection film formed on the thin-film capacitor. The memory chip may be mounted face-down on the protection film. The second insulating layer may be formed on the first insulating layer except for the signal input portion of the transmission line. The first plane electrode of the thin-film capacitor may be formed on the second insulating layer. The first power supply output portion may include first power supply output wiring formed on the second insulating layer. The second power supply output portion may include second power supply output wiring formed on the second insulating layer. The signal output portion of the transmission line may include a via formed in the second insulating layer, and signal output wiring connected to the via and formed on the second insulating layer. The substrate may include a plurality of connecting pads connected to the first power supply input portion, the second power supply input portion, and the signal input portion. The first power supply input portion, the second power supply input portion, and the signal input portion may be connected to the plurality of connecting pads by wire bonding. The first power supply output wiring, the second power supply output wiring, and the signal output wiring may be connected to the plurality of center pads by a bump.

According to this configuration, in the semiconductor memory device provided such that the memory chip is mounted face-down on the substrate, the power supply noise reducing effect can be improved and the need for an opening portion for external connection on the substrate on which the memory chip is mounted can be eliminated. In this configuration, the back surface of the memory chip can be exposed, and thus a heat-dissipating member such as a heat spreader can be provided on the back surface of the memory chip.

The semiconductor memory device may include a heat-dissipating member disposed on the back surface of the memory chip.

According to this configuration, heating of the memory chip can be reduced by the heat-dissipating member, whereby the operational reliability of the semiconductor memory device can be increased.

The semiconductor memory device may include at least a pair of the thin-film capacitors formed on both sides of the center pad region.

According to this configuration, in the semiconductor memory device having a structure such that the memory regions are divided by the center pad region, the thin-film capacitor can be provided corresponding to each memory region.

In the semiconductor memory device, the second plane electrode may be divided into a plurality of portions in a region corresponding to the first plane electrode in a planar view.

According to this configuration, a plurality of thin-film capacitors can be formed for a single common first plane electrode. Thus, this configuration can meet a memory chip provided with a plurality of different power supply voltages.

According to the present invention, in a semiconductor memory device provided with a memory chip including a center pad, the effect of reducing the power supply noise in a high-frequency interface can be improved, and the need for an opening portion for external connection on a substrate on which a memory chip is mounted can be eliminated.

DETAILED DESCRIPTION

<First Embodiment>

A first embodiment of the present invention will be described with reference to FIGS. 1 to 7.

1. Configuration of Semiconductor Memory Device

Figure 1:
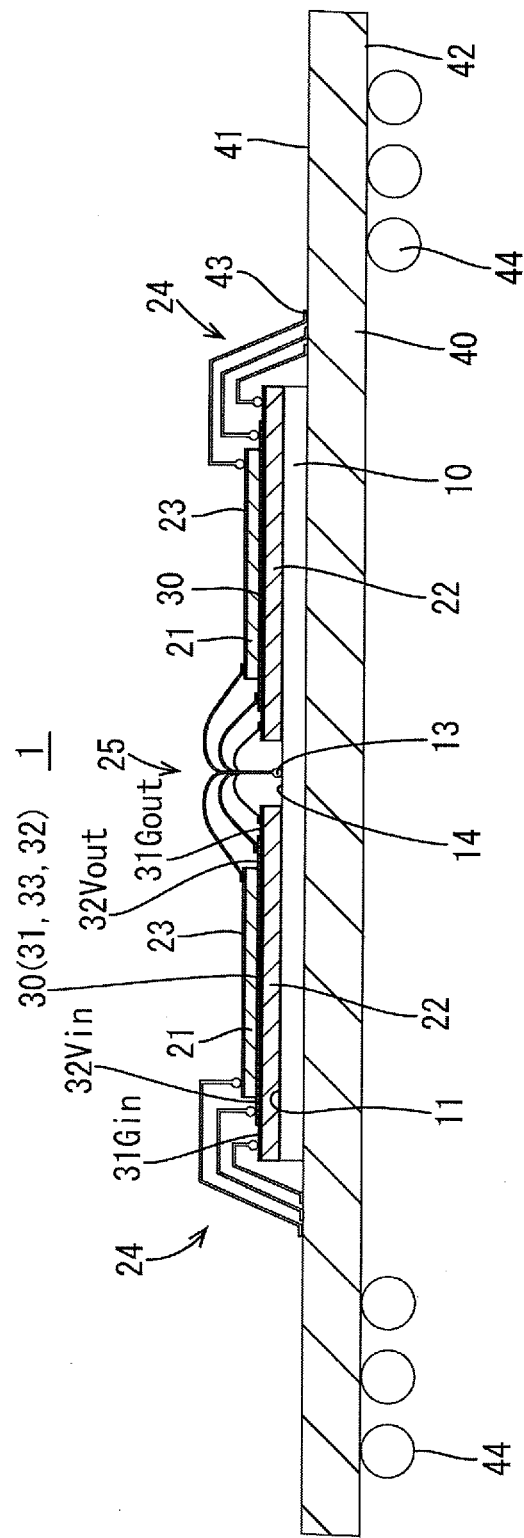
FIG. 1 is a schematic cross-sectional view of a semiconductor memory device according to a first embodiment.

As illustrated in FIG. 1, a semiconductor memory device 1 according to the first embodiment mainly includes a memory chip 10, a thin-film capacitor 30, and an intermediate substrate (an example of "substrate") 40.

The memory chip 10 includes a circuit surface 11 (see FIG. 2) including a center pad region 14 in which a plurality of center pads 13 is formed, and a back surface 12 which is a surface on the opposite side to the circuit surface 11. As illustrated in FIG. 1, the memory chip 10 is mounted face-up on the intermediate substrate 40 with the circuit surface 11 on the opposite side to the intermediate substrate 40. The memory chip 10 is a DDR3-SDRAM, for example. The memory chip 10, however, is not limited to DDR3-SDRAM, and may be any memory chip with the circuit surface 11 including the center pad region 14.

Figure 2:
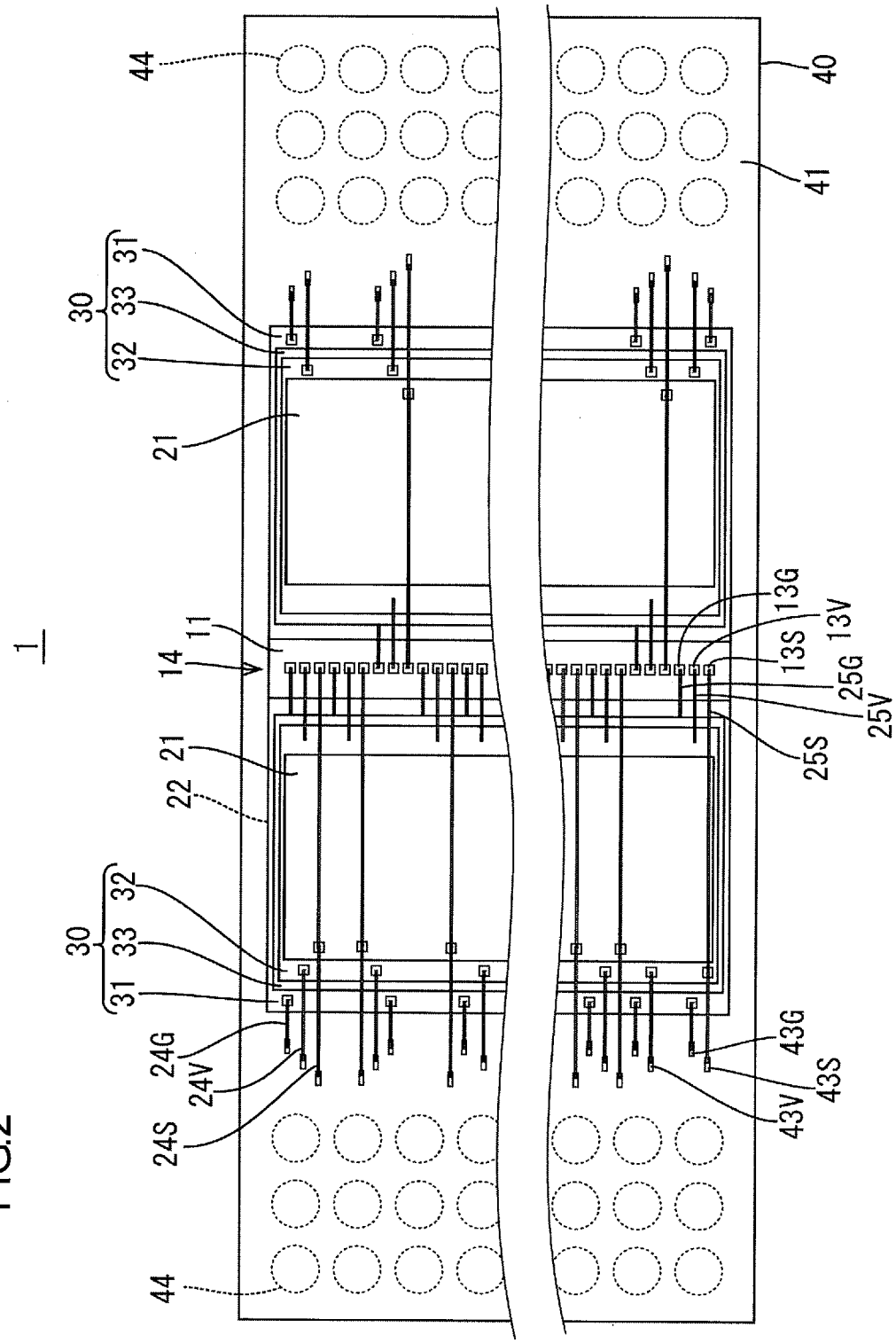
FIG. 2 is a schematic partial plan view of the semiconductor memory device according to the first embodiment.

As illustrated in FIG. 2, for example, the thin-film capacitor 30 is disposed at a position facing the circuit surface 11 of the memory chip 10 except for the center pad region 14. In the first embodiment, as illustrated in FIG. 2, a pair of the thin-film capacitors 30 is formed on both sides of the center pad region 14. Thus, in the semiconductor memory device having the structure where the memory region is divided by the center pad region 14, the thin-film capacitor 30 can be provided corresponding to each memory region.

Figure 3:
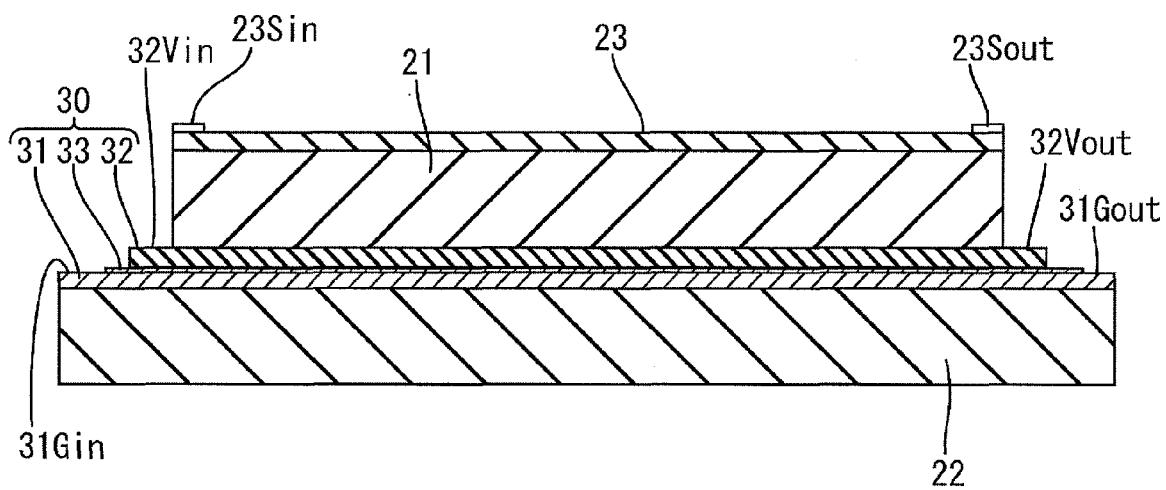
FIG. 3 is a schematic cross-sectional view illustrating a configuration of a thin-film capacitor.

Each thin-film capacitor 30 is formed at a position spaced apart from the center pads 13 in the center pad region 14 by, for example, approximately 100 μm (micrometers). As illustrated in FIG. 3, the thin-film capacitor 30 includes a first plane electrode 31, a thin-film dielectric layer 33, and a second plane electrode 32.

The first plane electrode 31 includes a first power supply input portion 31Gin to which a ground voltage (zero potential) Gnd to the memory chip 10 is provided, and a first power supply output portion 31Gout for applying the ground voltage Gnd to a center pad 13G. The first plane electrode 31 is formed by sputtering, for example, and formed from a copper thin-film having a film thickness of 2 μm or more.

The thin-film dielectric layer 33 is formed from paraelectric material (such as SrTiO) or ferroelectric material (such as BST), having a film thickness of 1 μm or less, for example.

The second plane electrode 32 is formed on the thin-film dielectric layer 33 by sputtering, for example, as in the case of the first plane electrode 31, and formed from a copper thin-film having a film thickness of 2 μm or more. The second plane electrode 32 includes a second power supply input portion 32Vin to which a predetermined positive voltage Vdd to the memory chip 10 is supplied, and a second power supply output portion 32Vout for applying the predetermined positive voltage Vdd to a center pad 13V.

The ground voltage Gnd corresponds to the power supply voltage of one polarity applied to the memory chip 10, and the positive voltage corresponds to the power supply voltage of the other polarity applied to the memory chip 10. However, this is not a limitation and the opposite may be the case. Namely, the power supply voltage of one polarity may provide the positive voltage Vdd, and the power supply voltage of the other polarity may provide the ground voltage Gnd. In the present embodiment, the reference numerals for structural elements related to the positive voltage Vdd are given the suffix "V", while the reference numerals for structural elements related to the ground voltage Gnd are given the suffix "G". Structural elements related to signals other than power supply signals are given the suffix "S". When there is no need for making such distinction, none of the suffixes "V", "G", or "S" are given to the relevant reference numerals.

The intermediate substrate 40 includes a mount surface 41 on which the memory chip 10 is mounted face-up, and an external connection surface 42 which is a surface on the opposite side to the mount surface 41. On the mount surface 41, a plurality of connecting pads 43 (see FIG. 4) for connection with the memory chip 10 and wiring (not shown) are formed. The external connection surface 42 is provided with a plurality of solder balls 44 for connecting the semiconductor memory device 1 to a motherboard and the like, and with wiring (not shown). Specifically, the external connection surface 42 is provided with a BGA. In the intermediate substrate 40, via holes and the like (not shown) are provided for connecting the mount surface 41 and the external connection surface 42. The intermediate substrate 40 is an organic substrate, for example. The external connection surface 42 may be provided with a LGA instead of a BGA.

The semiconductor memory device 1 is further provided with a first insulating layer 21 and a second insulating layer 22. As illustrated in FIG. 1, the first insulating layer 21 is formed on the opposite side to the memory chip 10 with respect to the thin-film capacitor 30. Specifically, as illustrated in FIG. 3, the first insulating layer 21 is formed on the second plane electrode 32 except for the second power supply input portion 32Vin and the second power supply output portion 32Vout. On the first insulating layer 21, transmission lines 23 are formed. The first insulating layer 21 is made of a thermosetting resin, such as BT resin, for example, gluing the transmission lines 23 in parallel. Preferably, the first insulating layer 21 has a layer thickness of 50 μm or more.

The transmission lines 23 include a signal input portion 23Sin to which a signal to the memory chip 10 is supplied, and a signal output portion 23Sout for supplying the signal to the center pad 13G. The transmission lines 23 present on the first insulating layer 21 provide transmission lines for all signals corresponding to all of the pads of the memory chip 10, except for those of the power supply system (Vdd and Gnd). The characteristic impedance of the transmission lines 23 is set to a value recommended by the memory chip 10.

The characteristic impedance of the transmission lines 23 is determined by the relative permittivity of the material for the first insulating layer 21, the width of the transmission lines 23, the distance between the transmission lines 23 and the second plane electrode 32 of the thin-film capacitor 30 (the layer thickness of the first insulating layer 21), and the like. For example, when the first insulating layer 21 is made of a BT resin with the relative permittivity $\epsilon_0=4.4$, the width of the transmission lines 23 is 25 μm and its thickness is 10 μm, and the recommended characteristic impedance is 100Ω, it is preferable that the first insulating layer (BT resin) 21 has a layer thickness of approximately 120 μm and the transmission lines 23 have a wiring pitch of approximately 100 μm.

The second insulating layer 22 is formed on the circuit surface 11 of the memory chip 10, and the first plane electrode 31 of the thin-film capacitor 30 is formed on the second insulating layer 22. The second insulating layer 22 is made of a thermosetting resin, such as BT resin, similarly to the first insulating layer 21. Preferably, the second insulating layer 22 has a layer thickness of 50 μm or more.

Figure 4:
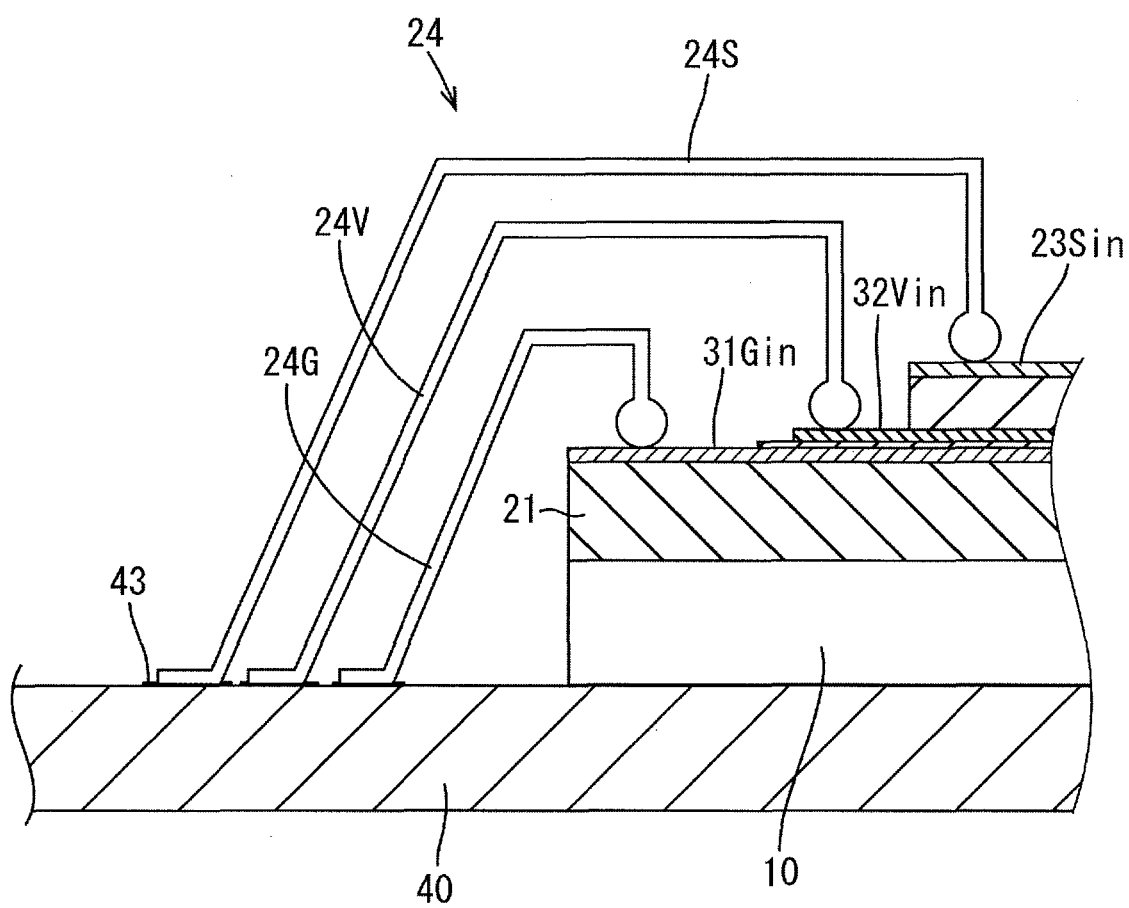
FIG. 4 is a schematic partially enlarged view illustrating connections on a substrate side.
Figure 5:
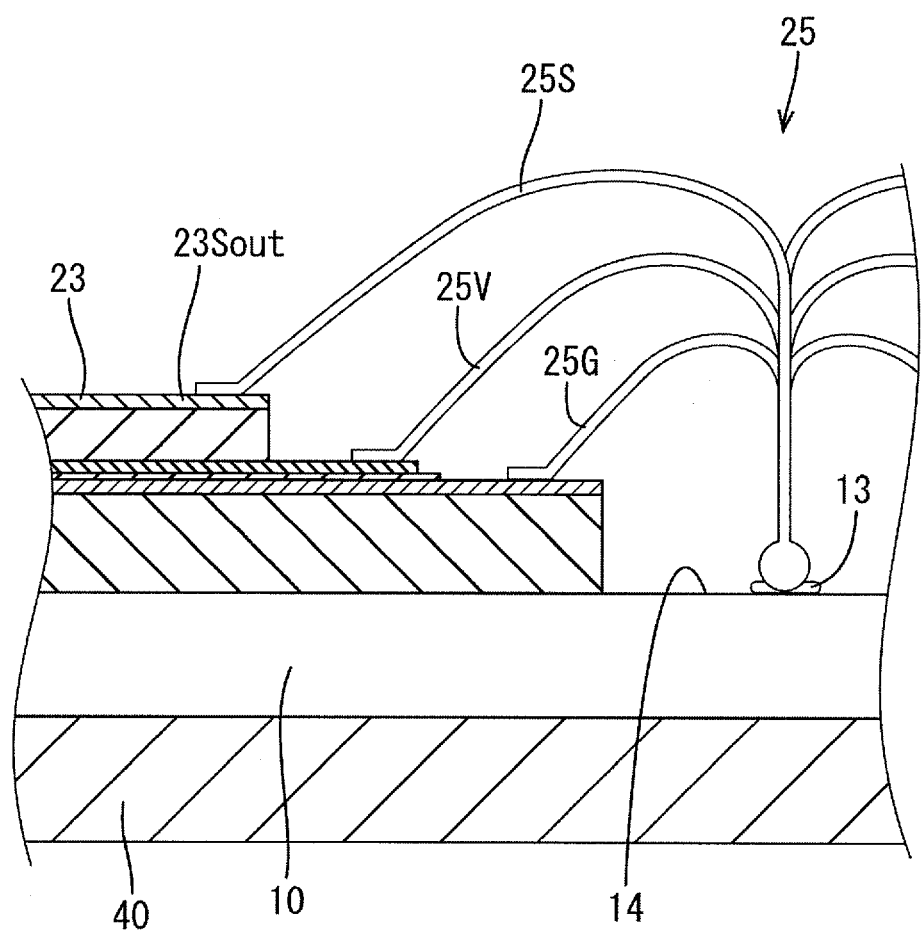
FIG. 5 is a schematic partially enlarged view illustrating connections on a center pad side.

As illustrated in FIG. 4, the first power supply input portion 31Gin, the second power supply input portion 32Vin, and the signal input portion 23Sin are connected to the plurality of connecting pads 43 by wire bonding using wires 24. As illustrated in FIG. 5, the first power supply output portion 31Gout, the second power supply output portion 32Vout, and the signal output portion 23Sout are similarly connected to the plurality of center pads 13 by wire bonding using wires 25.

The wires 25 may be Au (gold) lines, Al (aluminum) lines, or Cu (copper) lines, for example. Wire bonding may involve ultrasonic bonding using a wire bonder. In the present embodiment, the wires 25 are Au wires.

Figure 6:
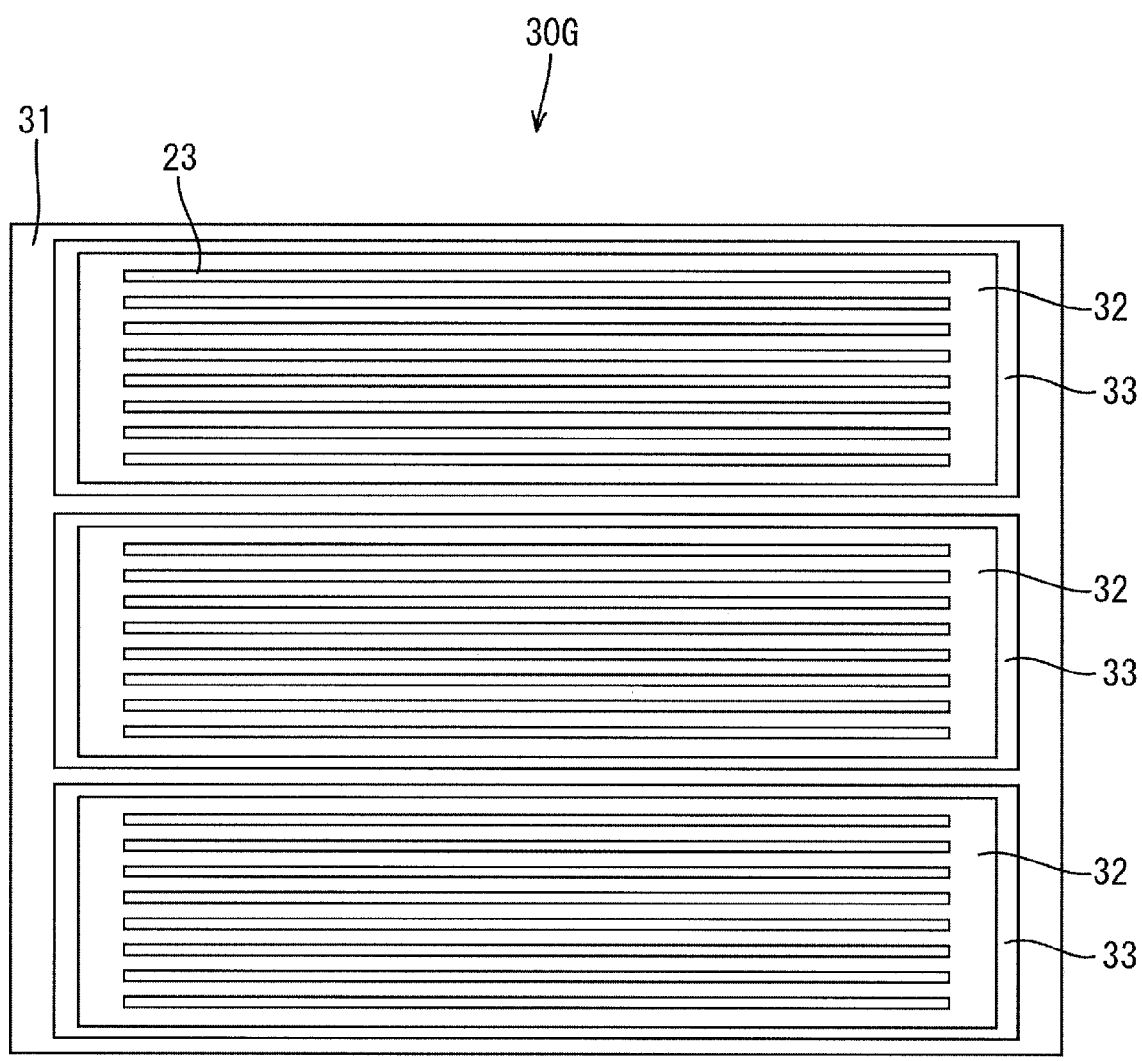
FIG. 6 is a schematic plan view illustrating another configuration example of the thin-film capacitor.

Normally, the memory chip 10 has a common ground GND and different power supply (positive voltage) Vdd systems (such as for an internal circuit and for DQ (data)). Accordingly, when the first plane electrode 31 of the thin-film capacitor 30 is used for the ground voltage Gnd, in order to separate the corresponding positive voltages (such as Vdd1 and Vdd2), the second plane electrode 32 and the thin-film dielectric layer 33 may be separated in accordance with the positive voltages, as illustrated in FIG. 6. FIG. 6 illustrates a thin-film capacitor group 30G separated into three thin-film capacitors 30. In this case, a plurality of thin-film capacitors can be formed with respect to a single common first plane electrode 31. Thus, the present embodiment can meet a memory chip provided with a plurality of different power supply voltages.

Figure 7:
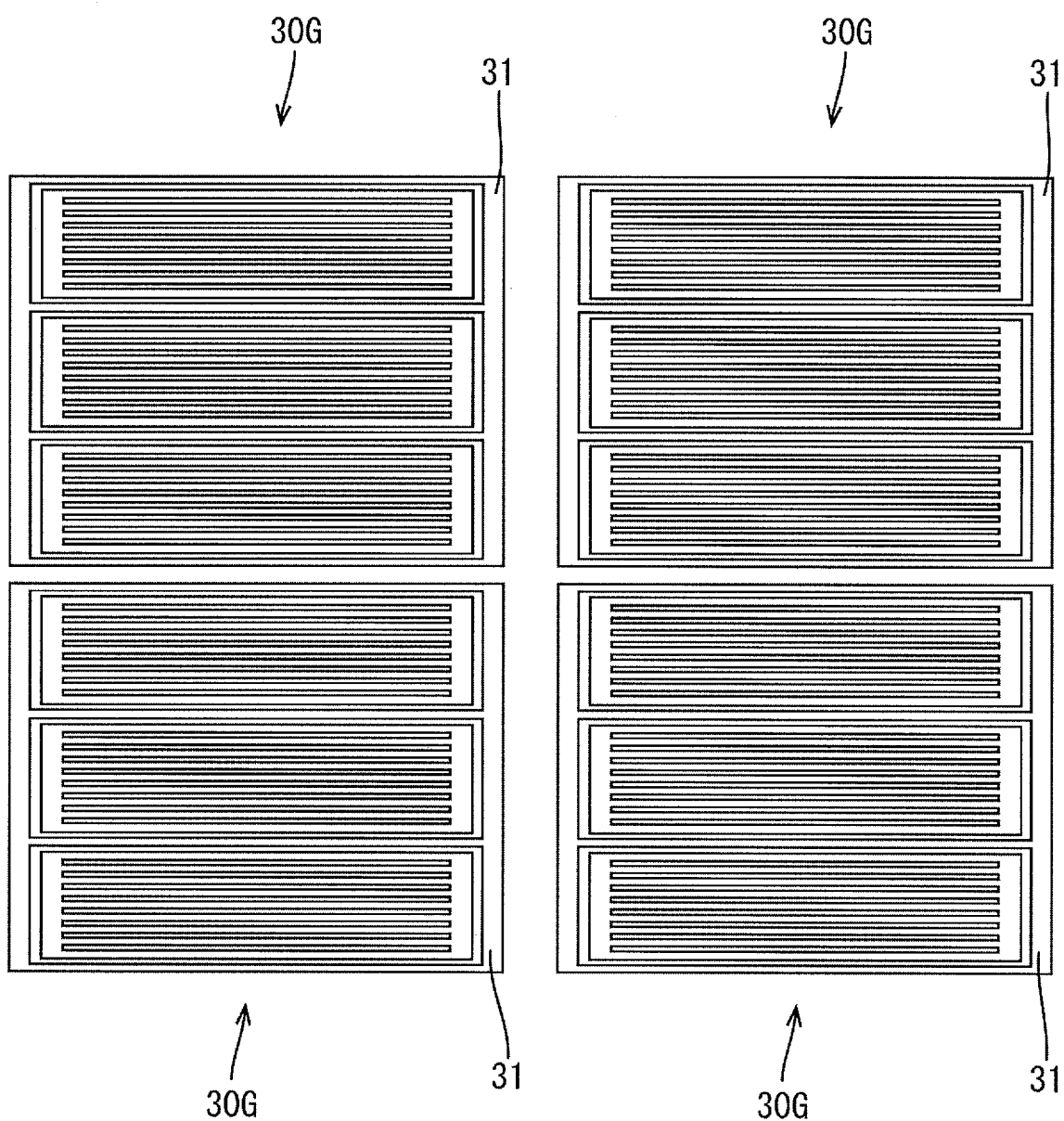
FIG. 7 is a schematic plan view illustrating another configuration example of the thin-film capacitor.

Further, when there is a plurality of ground GNDs in the memory chip 10, as illustrated in FIG. 7, the first plane electrode 31 may be divided. Specifically, FIG. 7 illustrates a configuration example of a thin-film capacitor provided with four thin-film capacitor groups 30G illustrated in FIG. 6 with the first plane electrode 31 divided into four.

2. Outline of Semiconductor Memory Device Fabricating Method

As illustrated in FIG. 3, the first plane electrode 31 of the thin-film capacitor 30 is formed on the second insulating layer 22, the thin-film dielectric layer 33 is formed on the first plane electrode 31, and the second plane electrode 32 is formed on the thin-film dielectric layer 33. Then, the first insulating layer 21 is formed on the second plane electrode 32, and the transmission lines 23 are formed on the first insulating layer 21.

Next, an intermediate product illustrated in FIG. 3 is disposed on both sides of the center pad region 14 on the circuit surface 11 of the memory chip 10. Then, by a well-known method, the memory chip 10 is die-bonded face-up on the intermediate substrate 40 with the solder balls 44 and the like formed thereon.

Next, the first power supply input portion 31Gin, the second power supply input portion 32Vin, and the signal input portion 23Sin are connected to the plurality of connecting pads 43 by wire bonding using Au wires 24. Further, the first power supply output portion 31Gout, the second power supply output portion 32Vout, and the signal output portion 23Sout are connected to the plurality of center pads 13 by wire bonding using Au wires 25.

By molding the memory chip 10 and the like to a predetermined size using mold resin (not shown) by a well-known molding technique, the semiconductor memory device 1 as illustrated in FIG. 1 is completed.

3. Effects of First Embodiment

In the first embodiment, the thin-film capacitor 30 is provided at the position facing the circuit surface 11 of the memory chip 10, except for the center pad region 14. In the first embodiment, the thin-film capacitor 30 is formed on the second insulating layer 22 formed on the circuit surface 11 of the memory chip 10, whereby the connecting distance between the thin-film capacitor 30 and the intermediate substrate 40 and the center pads 13 of the memory chip 10 can be minimized. Namely, the length of the Au wires 24 and 25 can be minimized. Accordingly, in the semiconductor memory device 1 provided with the memory chip 10 including the center pads 13, the effect of reducing the power supply noise can be improved by the thin-film capacitor 30 and the like.

In other words, the thin-film dielectric layer 33 including paraelectric material or high-dielectric material and having high capacitance density can be formed at a close distance from the center pads 13, and an environment where sufficient charges can be given to the power supply system in a high frequency region of several GHz or higher can be provided. Further, the power supply impedance at high frequencies can be lowered. As a result, the semiconductor memory device 1, which improves the effect of reducing the power supply noise in a high-frequency interface and does not require an opening portion for external connection on the mount substrate of the memory chip, can be provided.

The first plane electrode 31 and the second plane electrode 32 of the thin-film capacitor 30 are provided with the power supply output portions (31Gout, 32Vout) for applying the power supply voltages (Gnd, Vdd) to the center pads 13. The transmission lines 23 are provided with the signal output portion 23Sout for applying a signal such as an address signal to the center pads 13. With this configuration, the thin-film capacitor 30, the intermediate substrate 40, and the center pads 13 of the memory chip 10 can be connected by wire bonding without forming an opening portion for external connection on the intermediate substrate 40 on which the memory chip 10 is mounted.

<Second Embodiment>

Figure 8:
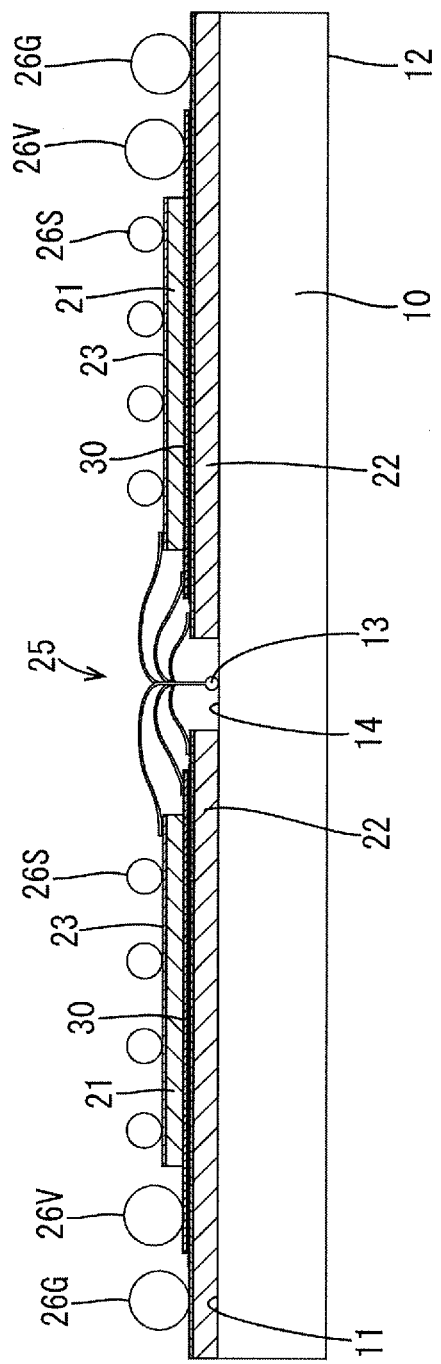
FIG. 8 is a schematic cross-sectional view of a semiconductor memory device according to a second embodiment.
Figure 9:
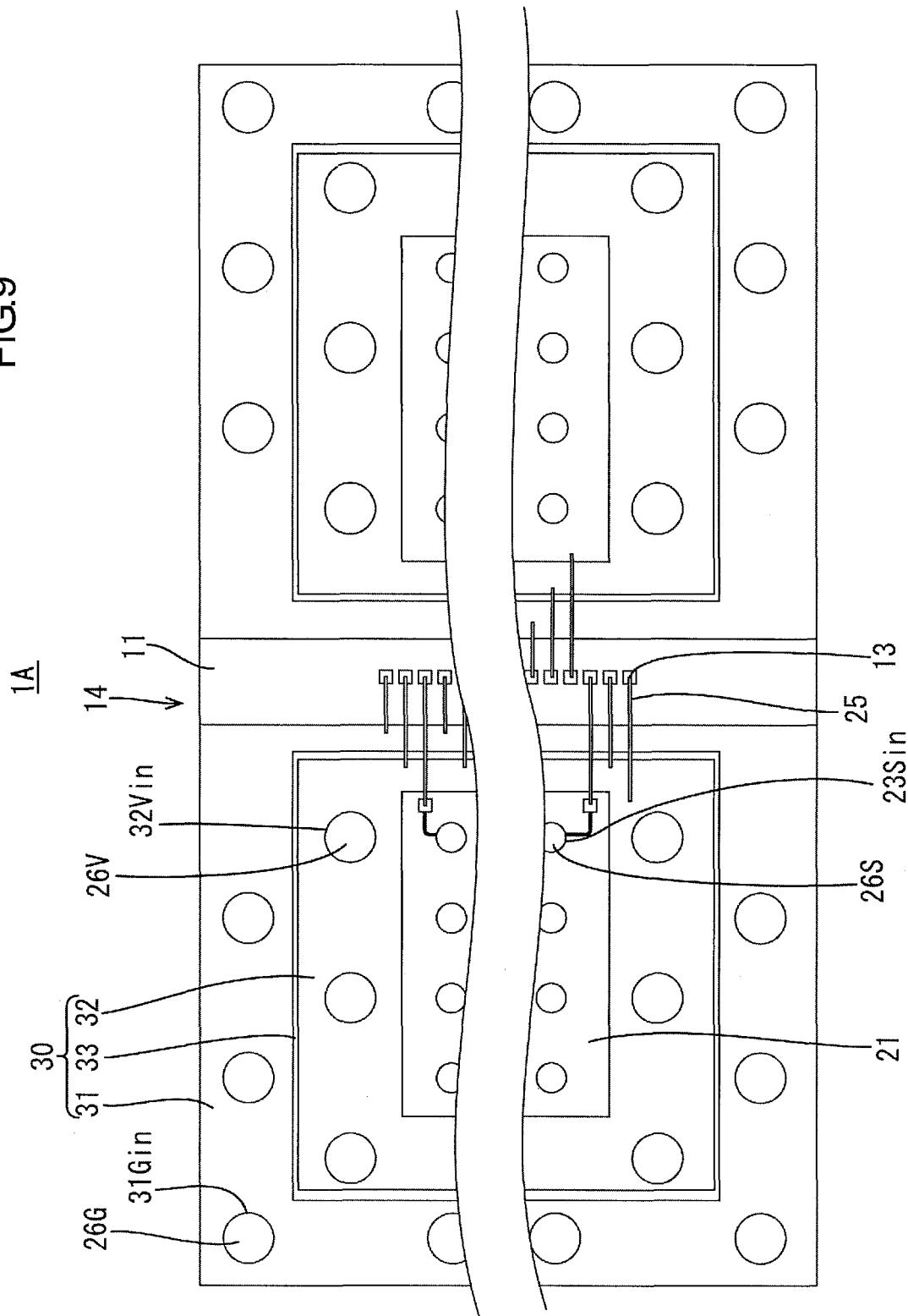
FIG. 9 is a schematic partial plan view of the semiconductor memory device according to the second embodiment.

With reference to FIGS. 8 and 9, a second embodiment will be described. The same elements as in the first embodiment will be designated with the same reference numerals, and their description will be omitted. Accordingly, only the differences from the first embodiment will be described.

As illustrated in FIG. 8, a semiconductor memory device 1A according to the second embodiment generally differs from the semiconductor memory device 1 according to the first embodiment in that the intermediate substrate 40 is not included. Namely, the semiconductor memory device 1A according to the second embodiment is formed as a CSP.

Thus, the thin-film capacitor 30 and the transmission lines 23 are connected to the outside via solder balls 26, while the thin-film capacitor 30 and the transmission lines 23 are connected to the center pads 13 by wire bonding using the Au wires 25.

Specifically, as illustrated in FIG. 9, the first plane electrode 31 is provided with regions in four directions that do not overlap with the thin-film dielectric layer 33 and the second plane electrode 32. In three of the directions excluding the connecting portion with the center pads 13, regions where the solder balls 26G can be mounted are provided. Similarly, the second plane electrode 32 is provided with regions, where the solder balls 26V can be mounted, in three directions.

In the first power supply input portion 31Gin of the first plane electrode 31, the solder balls (an example of "first connecting bump") 26G are formed, and in the second power supply input portion 32Vin of the second plane electrode 32, the solder balls (an example of "first connecting bump") 26V are formed. The solder balls 26G and the solder balls 26V have approximately the same height (diameter), even though there is a difference corresponding to the sum of the film thicknesses of the thin-film dielectric layer 33 and the second plane electrode 32 (on the order of 3 μm).

In the signal input portion 23Sin of the transmission lines 23, solder balls 26S (an example of "second connecting bump") are formed to have a height (diameter) smaller than the solder balls 26G and 26V by the thickness (on the order of 50 μm) of the first insulating layer 21.

The solder balls 26G and 26V have a diameter on the order of 200 μm, while the solder balls 26S have a diameter on the order of 150 μm. The first power supply input portion 31Gin and the second power supply input portion 32Vin are gold-plated lands with a diameter of 150 μm to 200 μm, and the signal input portion 23Sin is a gold-plated land with a diameter of 100 μm to 150 μm. The second connecting bump is not limited to the solder balls 26S, and may be a gold stud bump, for example.

Thus, in the second embodiment, the semiconductor memory device 1A, which improves the effect of reducing the power supply noise in a high-frequency interface by the thin-film capacitor 30 and the like and does not require an opening portion for external connection on the intermediate substrate 40 on which the memory chip 10 is mounted, can be provided as a CSP.

<Third Embodiment>

Figure 10:
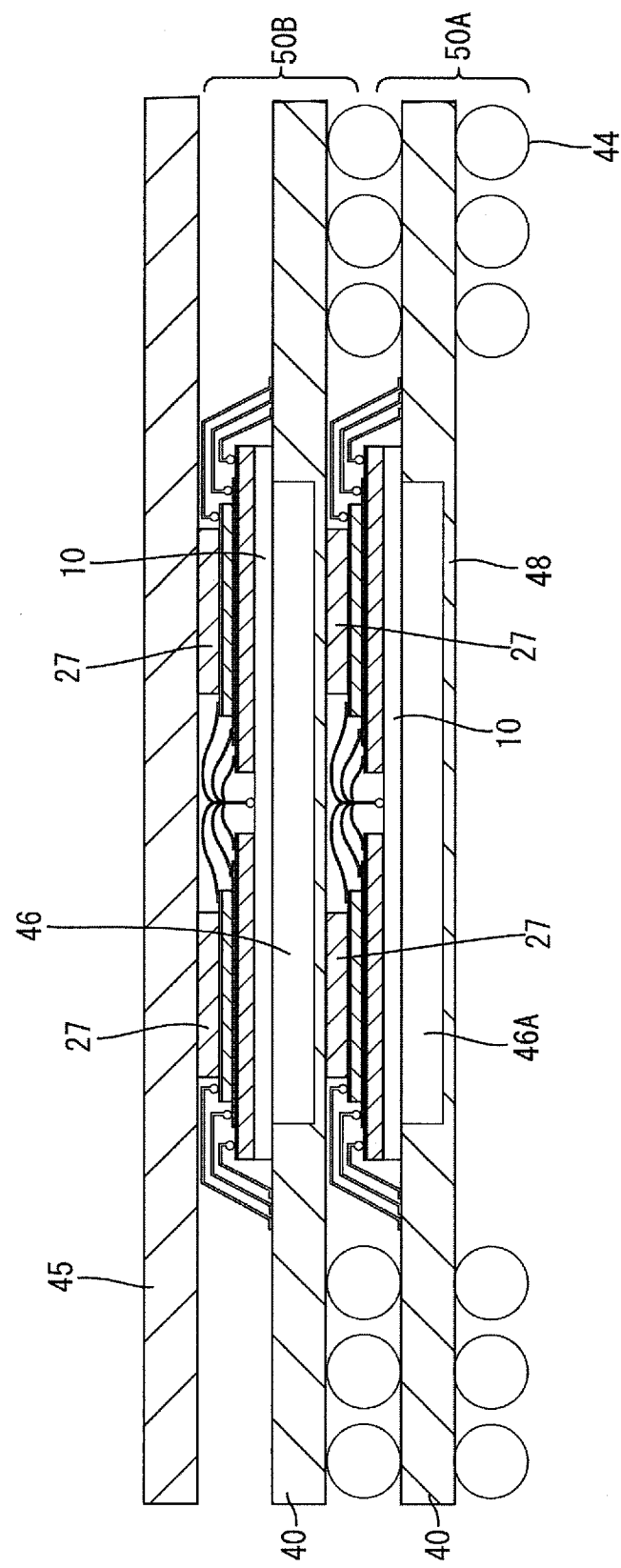
FIG. 10 is a schematic cross-sectional view of a semiconductor memory device according to a third embodiment.
Figure 11:
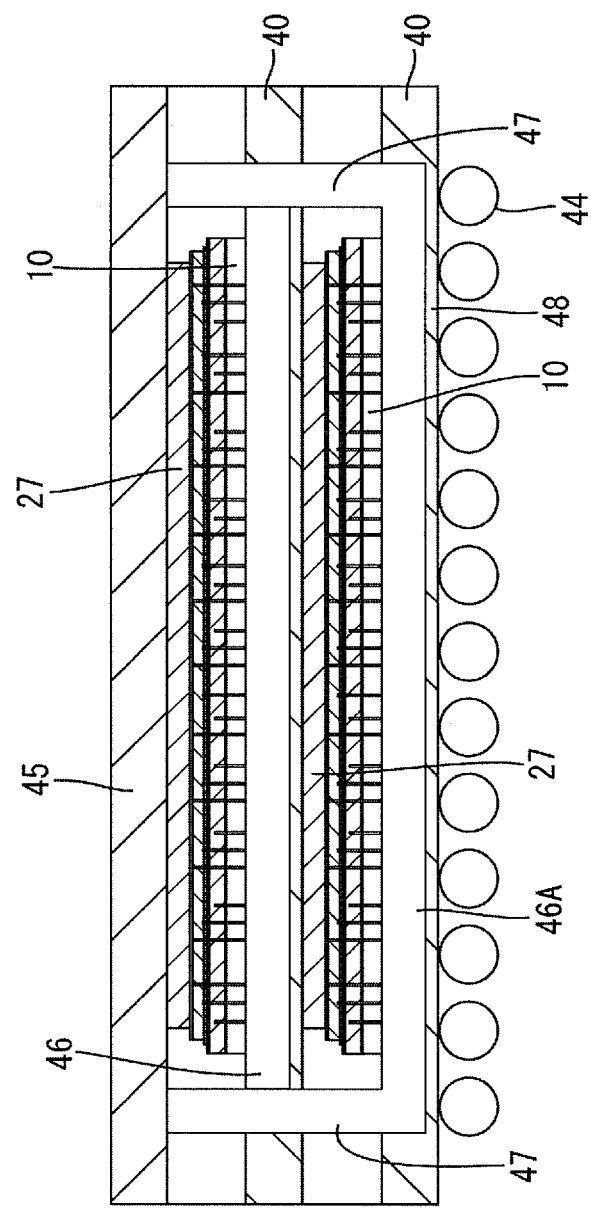
FIG. 11 is another schematic cross-sectional view of the semiconductor memory device according to the third embodiment.
Figure 12:
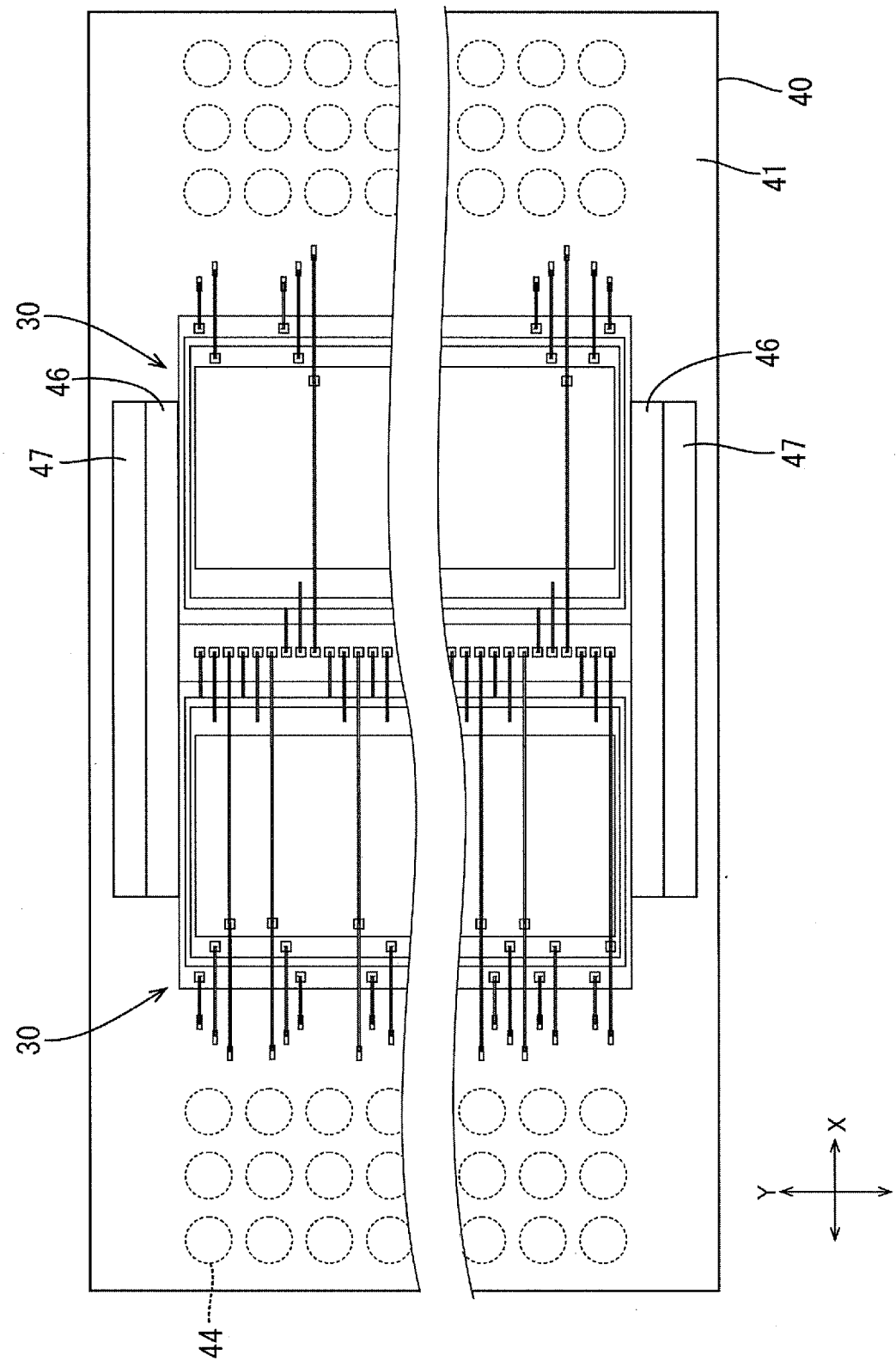
FIG. 12 is a schematic partial plan view of the semiconductor memory device according to the third embodiment.

With reference to FIGS. 10 to 12, a third embodiment will be described. The same elements as in the first embodiment will be designated with the same reference numerals, and their description will be omitted. Accordingly, only the differences from the first embodiment will be described.

In the third embodiment, as illustrated in FIG. 10, a storage unit 50 is formed from the intermediate substrate 40, the memory chip 10, the second insulating layer 22, the thin-film capacitor 30, the first insulating layer 21, and a protection layer 27 that are stacked in this order. A semiconductor memory device 1B is provided with at least two tiers (two tiers in the third embodiment) of storage units 50A and 50B that are stacked.

Each intermediate substrate 40 includes a heat-dissipating plate (an example of "metal plate") 46 on which the memory chip 10 is mounted face-up. In each intermediate substrate 40, a thin-wall portion 48 for arranging the heat-dissipating plate 46 is formed. The heat-dissipating plate 46 can be disposed on the substrate due to the thin-wall portion 48. The method of disposing the heat-dissipating plate 46 on the intermediate substrate 40 is not limited to the method using the thin-wall portion 48. For example, the intermediate substrate 40 may be provided with an opening for arranging the heat-dissipating plate 46.

As illustrated in FIG. 12, the heat-dissipating plate 46 in a planar view has a rectangular shape with a length is shorter than the length of the memory chip 10 in a direction (arrow X in FIG. 12) along the direction in which the wire-bonding wires 24 and 25 are laid, and with a length greater than the length of the memory chip 10 in a direction (arrow Y) perpendicular to the wire-laid direction. The heat-dissipating plate 46 is a copper plate with a planar shape of 1 mm×2 mm and having a thickness of 2 mm to 3 mm, for example.

As illustrated in FIG. 10, on top of the protection layer 27 of the uppermost-tier storage unit 50B, there is disposed a heat spreader (an example of "heat-dissipating member") 45 thermally connected to the heat-dissipating plates 46 and 46A. FIG. 12 is a plan view excluding the heat spreader 45.

Further, as illustrated in FIG. 11, the heat-dissipating plate 46A disposed on the lowermost-tier intermediate substrate 40 includes heat-transmitting portions 47 disposed at the ends in the longitudinal direction (arrow Y in FIG. 12) and thermally connected to the heat spreader 45 and the heat-dissipating plate 46 disposed on the intermediate substrate 40 in a tier above the lowermost-tier. In the present embodiment, the heat-transmitting portions 47 are integrally formed with the heat-dissipating plate 46A. However, this is not a limitation, and the heat-transmitting portions 47 may be formed independently from the heat-dissipating plate 46A.

The heat-transmitting portions 47 transmit the heat from the heat-dissipating plates 46 and 46A to the heat spreader 45. In other words, the heat generated from the storage unit 50 in each tier can be transmitted to the heat spreader 45 via the heat-transmitting portions 47, and dissipated via the heat spreader 45. The heat-dissipating plate 46 and the heat-transmitting portions 47 are glued to each other using Ag (silver) paste or silicon grease and the like so as to obtain preferable heat conduction.

Thus, according to the third embodiment, in the semiconductor memory device 1B formed by stacking the storage units 50 including the memory chips 10 in a plurality (two in this example) of tiers, the effect of reducing the power supply noise can be improved by the thin-film capacitor 30 and the like, and the need for an opening portion for external connection on the intermediate substrate 40 on which the memory chip 10 is mounted can be eliminated. Further, the heat generated by the respective memory chips 10 of the storage units 50 can be preferably dissipated. Thus, the operational reliability of the semiconductor memory device 1B can be increased.

<Fourth Embodiment>

With reference to FIGS. 13 to 16, a fourth embodiment will be described. The same elements as in the first embodiment will be designated with the same reference numerals, and their description will be omitted. Accordingly, only the differences from the first embodiment will be described.

Figure 13:
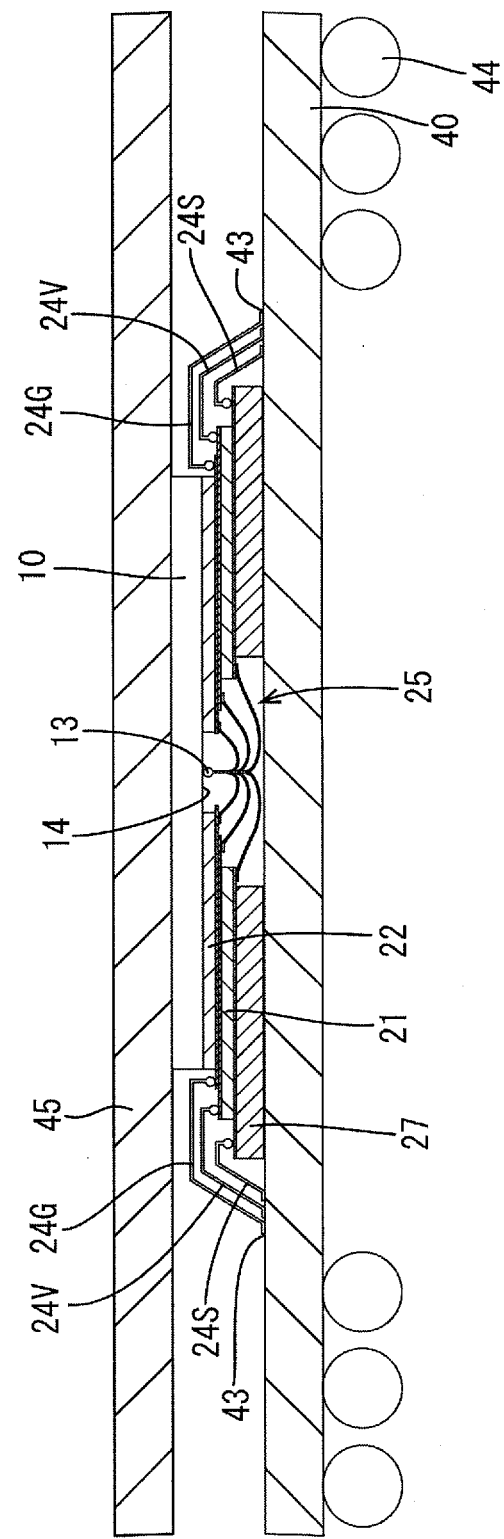
FIG. 13 is a schematic cross-sectional view of a semiconductor memory device according to a fourth embodiment.

In a semiconductor memory device 1C according to the fourth embodiment, the memory chip 10 is mounted face-down on the intermediate substrate 40, differently from the first to third embodiments. In other words, in the semiconductor memory device 1C, as illustrated in FIG. 13, the second insulating layer 22, the thin-film capacitor 30, the first insulating layer 21, the transmission lines 23, and the protection layer 27 that are disposed on the circuit surface 11 of the memory chip 10 are mounted on the intermediate substrate 40, while being vertically inverted such that the memory chip 10 is provided as the uppermost-layer and the protection layer 27 is provided as the lowermost-layer.

Thus, the present embodiment is similar to the first embodiment in that the thin-film capacitor 30 and the transmission lines 23 are connected to the memory chip 10 by wire bonding, but is different from the first embodiment in the location of the respective input portions.

Figure 14:
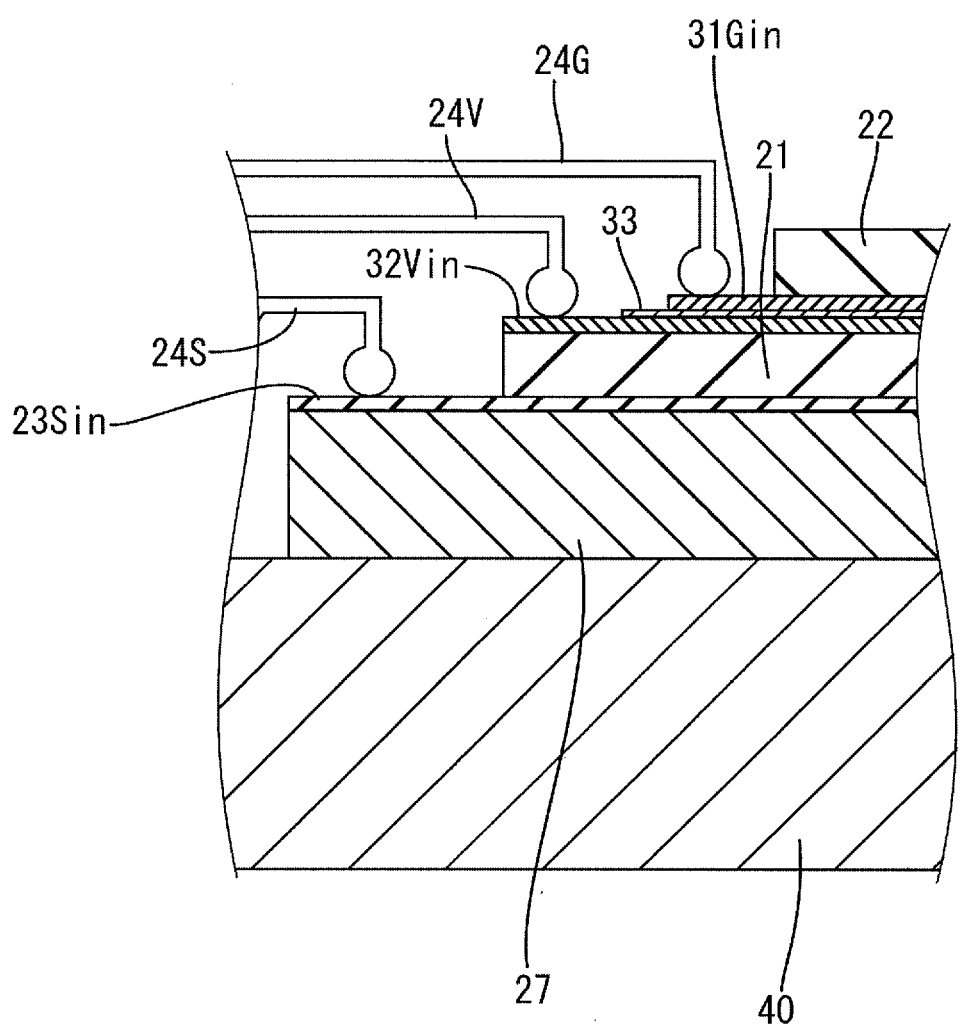
FIG. 14 is a schematic partially enlarged view illustrating connections on a substrate side according to the fourth embodiment.

Specifically, as illustrated in FIG. 14, the first power supply input portion 31Gin and the second power supply input portion 32Vin are disposed on the first insulating layer 21, and the signal input portion 23Sin is disposed on the protection layer 27. The first power supply input portion 31Gin, the second power supply input portion 32Vin, and the signal input portion 23Sin are connected to the plurality of connecting pads 43 on the intermediate substrate 40 by wire bonding using the wires 24, as in the first embodiment.

An example of the configuration where the respective input portions are located as illustrated in FIG. 14 will be described with reference to FIGS. 15 and 16. First, a metal base material, for example, is used to form a multilayer thin-film body including the second insulating layer 22 including a portion indicated by two-dot chain lines that are to be etched back (see FIG. 15), the thin-film capacitor 30, the first insulating layer 21, the transmission lines 23, and the protection layer 27, which are stacked in this order.

Figure 15:
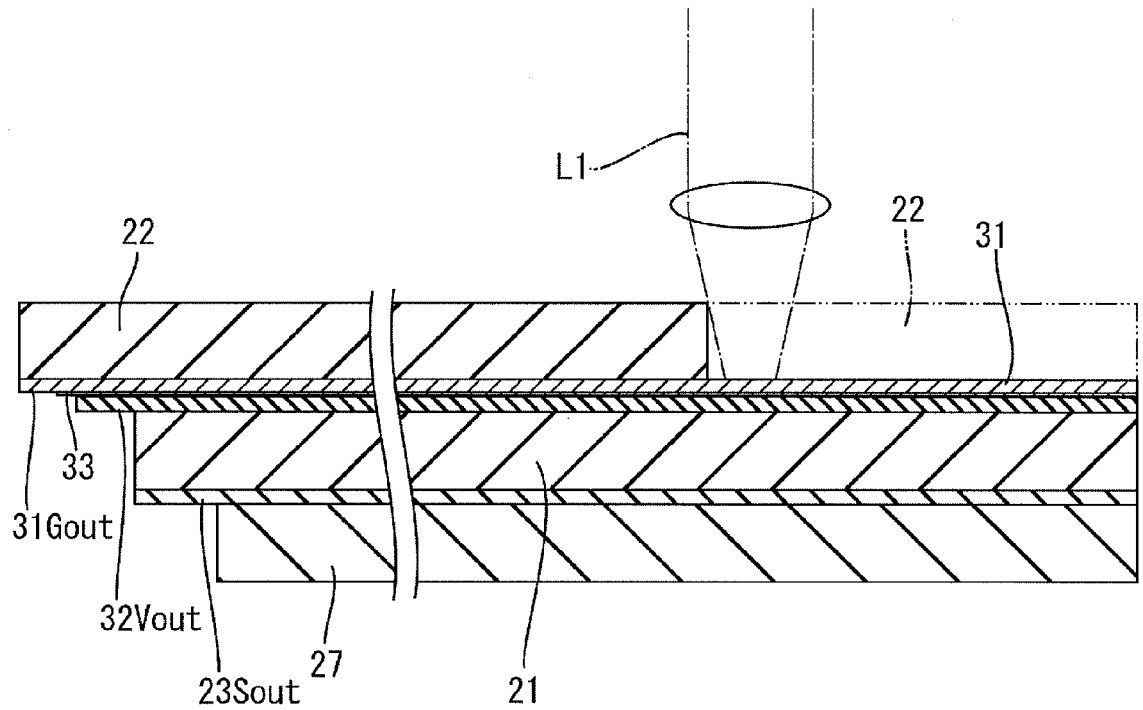
FIG. 15 is a partial cross-sectional view for describing etchback in the fourth embodiment.

Then, as illustrated in FIG. 15, with the multilayer thin-film body vertically inverted, the end of the second insulating layer 22 on the opposite side from the end having the first power supply output portion 31Gout and the like is irradiated with carbon dioxide ($CO_2$) laser light L1 so as to etch back and remove the end of the second insulating layer 22 indicated by the two-dot chain lines.

At this time, the carbon dioxide laser light L1 used has a long wavelength that decomposes only the second insulating layer 22 being an organic material while being reflected by the first plane electrode 31, made of metal such as copper, of the thin-film capacitor 30. Thus, the first plane electrode 31 can be exposed on the first insulating layer 21.

Figure 16:
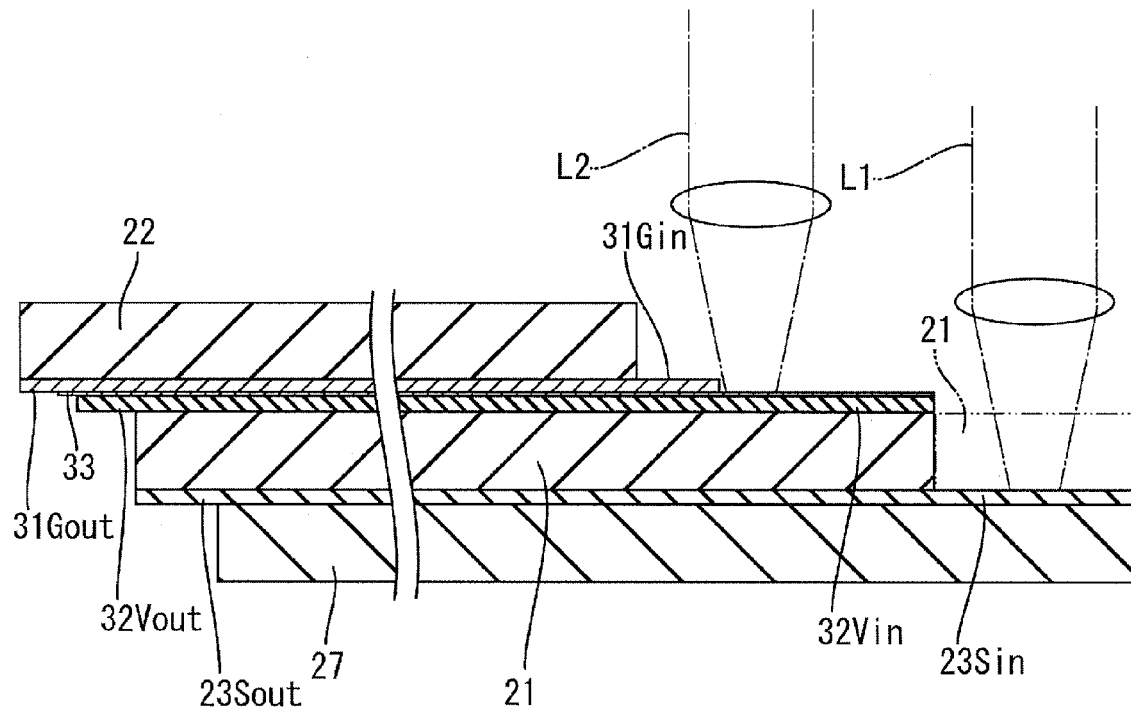
FIG. 16 is a partial cross-sectional view for describing etchback in the fourth embodiment.

Then, as illustrated in FIG. 16, the exposed first plane electrode 31 except for the portion serving as the first power supply input portion 31Gin is irradiated with ultraviolet ray (UV) laser light L2 having a short wavelength for a predetermined time so as to etch the first plane electrode 31 and expose the thin-film dielectric layer 33 made of paraelectric material such as SrTiO. Further, the exposed thin-film dielectric layer 33 except for an area in the vicinity of the first plane electrode 31 is irradiated with the ultraviolet ray laser light L2 for a predetermined time so as to etch the thin-film dielectric layer 33 and expose the second plane electrode 32. The exposed second plane electrode 32 except for the portion serving as the second power supply input portion 32Vin is further irradiated with the ultraviolet ray laser light L2 for a predetermined time so as to etch and remove the second plane electrode 32. Thus, the end of the first insulating layer 21 is exposed.

Next, the end of the exposed first insulating layer 21 being an organic material is irradiated with the carbon dioxide laser light L1 so as to etch back and remove the end of the first insulating layer 21. Accordingly, the portion of the transmission lines 23, which serves as the signal input portion 23Sin, is exposed on the protection layer 27. The multilayer thin-film body, having been subjected to the etchback process with regard to the input portions, is affixed on the circuit surface 11 of the memory chip 10. The multilayer thin-film body and the memory chip 10 are then subjected to wire bonding process. With the memory chip 10 disposed face-down, the multilayer thin-film body and the intermediate substrate 40 are subjected to wire bonding process.

In this case, the method for connecting the thin-film capacitor 30 and the memory chip 10 and the location of the respective output portions are similar to those of the first embodiment. In other words, the first power supply output portion 31Gout, the second power supply output portion 32Vout, and the signal output portion 23Sout are connected to the plurality of center pads 13 by wire bonding using Au wires 25 in the same manner as in the first embodiment illustrated in FIG. 5.

Thus, in the fourth embodiment, the first insulating layer 21 on the center pad side is formed on the thin-film capacitor 30 with the first power supply output portion 31Gout and the second power supply output portion 32Vout being exposed. On the opposite side from the center pad side, i.e., on the intermediate substrate 40 side, the first insulating layer 21 is etched back so that the signal input portion 23Sin is exposed on the protection layer 27.

The second insulating layer 22 on the opposite side from the center pad side, i.e., on the intermediate substrate 40 side, is etched back so that the first power supply input portion 31Gin and the second power supply input portion 32Vin are exposed on the first insulating layer 21.

The protection layer 27 on the center pad side is formed so as to expose the signal output portion 23Sout on the second insulating layer 22. On the opposite side from the center pad side, the protection layer 27 is formed so as to expose the signal input portion 23Sin thereon. The configuration enables wire bonding connections on the center pad side and the intermediate substrate 40 side of the multilayer thin-film body in the configuration where the memory chip 10 is mounted face-down on the intermediate substrate 40.

In the configuration where the memory chip 10 is mounted face-down on the intermediate substrate 40 in the uppermost-layer, the back surface 12 of the memory chip 10 is exposed. Accordingly, as illustrated in FIG. 13, the heat spreader 45 can be disposed on the back surface 12 of the memory chip 10.

According to the fourth embodiment, in the semiconductor memory device 1C provided such that the memory chip 10 is mounted face-down on the intermediate substrate 40, the effect of reducing the power supply noise in a high-frequency interface can be improved by the thin-film capacitor 30 and the like, and the need for an opening portion for external connection on the intermediate substrate 40 can be eliminated. Further, with this configuration, the back surface 12 of the memory chip 10 can be exposed, whereby a heat-dissipating member such as the heat spreader 45 can be provided on the back surface 12 of the memory chip.

In a memory interface for high speed access, it is important how to connect the heat generated at a memory chip junction to a heat spreader or a heat sink with low thermal resistance and how to dissipate the heat. In the fourth embodiment, such a problem is readily solved by the configuration such that the heat spreader 45 is disposed on the back surface 12 of the memory chip 10 while the effect of reducing the power supply noise in a high-frequency interface is improved. The etchback method is not limited to the method using laser light. For example, etching solution method using a normal resist or a method using gas may be employed.

<Fifth Embodiment>

Figure 17:
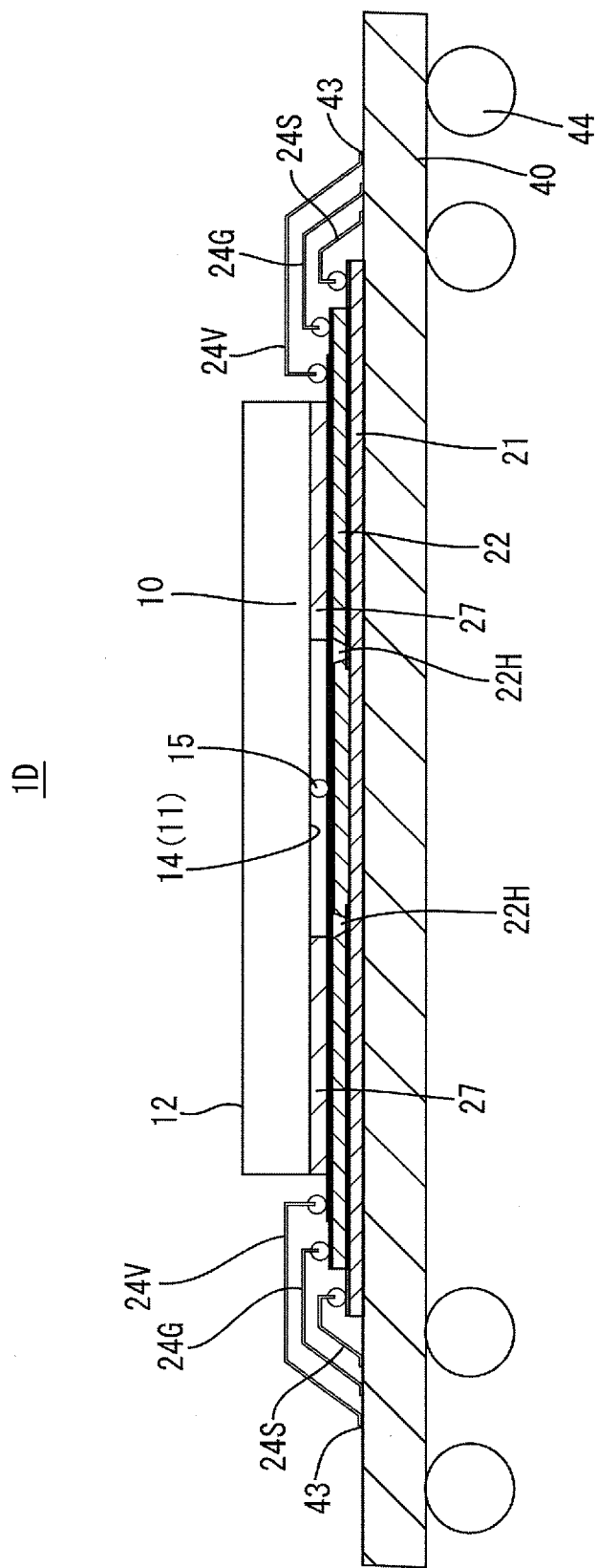
FIG. 17 is a schematic cross-sectional view of a semiconductor memory device according to a fifth embodiment.
Figure 18:
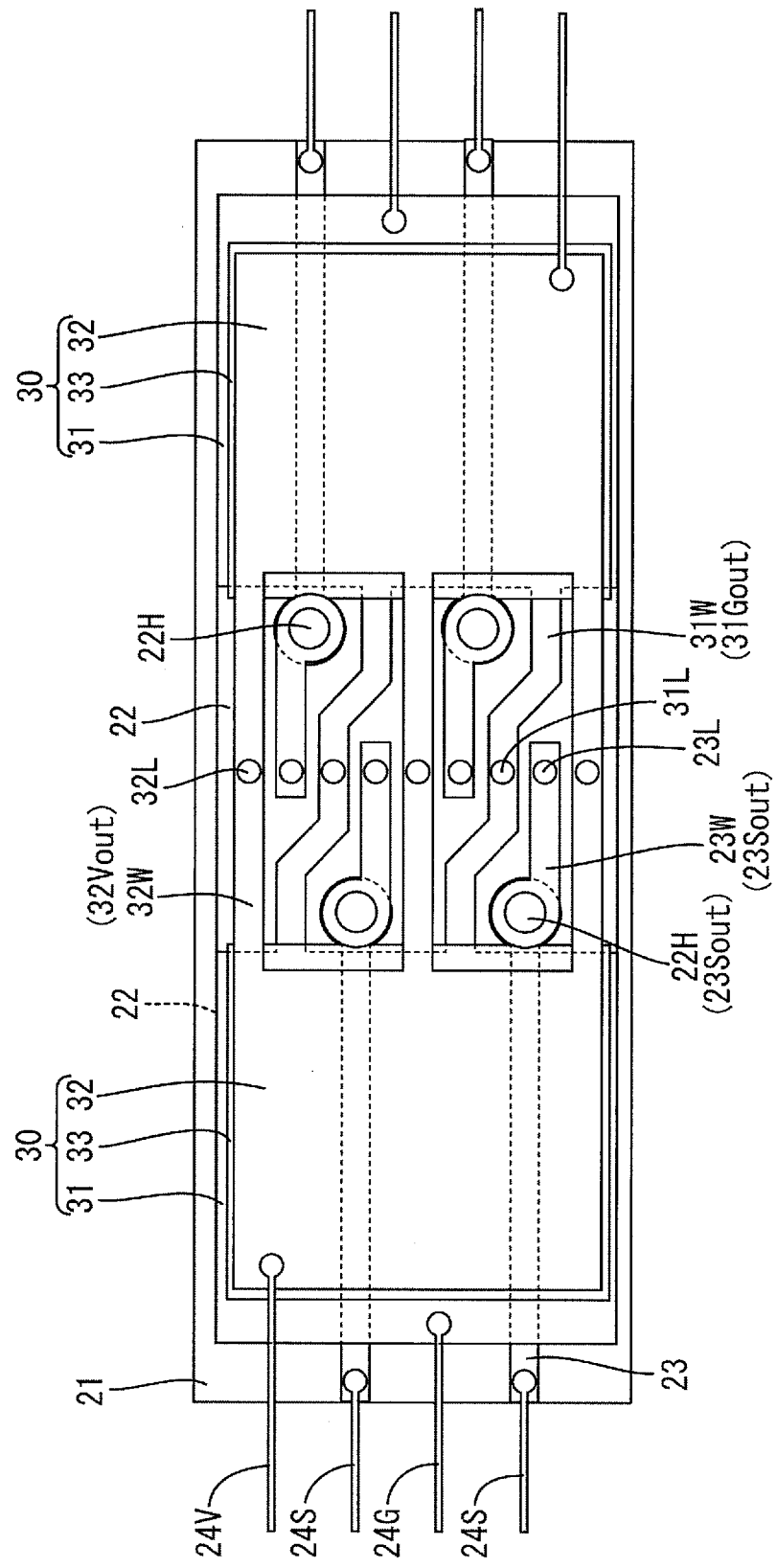
FIG. 18 is a schematic plan view of the semiconductor memory device according to the fifth embodiment.
Figure 19:
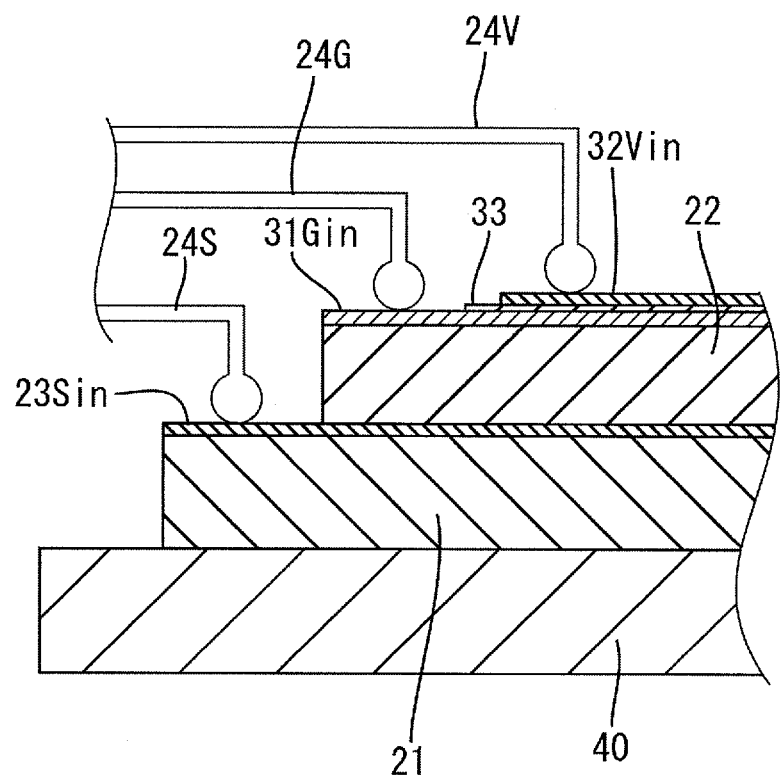
FIG. 19 is a schematic partially enlarged view illustrating connections on a substrate side according to the fifth embodiment.

With reference to FIGS. 17 to 19, a fifth embodiment will be described. In a semiconductor memory device 1D according to the fifth embodiment, as in the fourth embodiment, the memory chip 10 is mounted face-down on the intermediate substrate 40. The same elements as in the first embodiment will be designated with the same reference numerals, and their description will be omitted. Accordingly, only the differences from the first embodiment will be described.

The fifth embodiment differs from the fourth embodiment in that the first power supply output portion 31Gout, the second power supply output portion 32Vout, and the signal output portion 23Sout are connected to the plurality of center pads 13 via bumps 15 formed on the center pads 13.

Specifically, as illustrated in FIG. 18, the first power supply output portion 31Gout includes first power supply output wiring 31W formed on the second insulating layer 22. The second power supply output portion 32Vout includes second power supply output wiring 32W formed on the second insulating layer 22. The signal output portion 23Sout of the transmission lines 23 includes a via 22H formed in the second insulating layer 22, and signal output wiring 23W connected to the via 22H and formed on the second insulating layer 22.

On the respective output wiring 23W, 31W, and 32W, there are formed lands 23L, 31L, and 32L connected to the bumps 15 formed on the center pads 13 of the memory chip 10. The bumps 15 are Au stud bumps or micro soldering bumps, for example.

As illustrated in FIG. 17, the first insulating layer 21 is formed on the intermediate substrate 40 and the second insulating layer 22 is formed on the first insulating layer 21, differently from the first embodiment. The thin-film capacitor 30 is formed on the second insulating layer 22, and the protection layer 27 is formed on the thin-film capacitor 30. The memory chip 10 is mounted face-down on the protection layer 27.

As illustrated in FIGS. 17 and 19, the first power supply input portion 31Gin, the second power supply input portion 32Vin, and the signal input portion 23Sin are connected to the plurality of connecting pads 43 by wire bonding using the Au wires 24, as in the first embodiment.

Thus, according to the fifth embodiment, similar to the fourth embodiment, in the semiconductor memory device configured such that the memory chip 10 is mounted face-down on the substrate, the semiconductor memory device 1D, which improves the effect of reducing the power supply noise by the thin-film capacitor 30 and the like and eliminates the need for an opening portion for external connection on the intermediate substrate 40 on which the memory chip 10 is mounted, can be provided. With this configuration, the back surface of the memory chip can be exposed, and thus the back surface of the memory chip can be provided with a heat-dissipating member such as a heat spreader.

<Other Embodiments>

The present invention is not limited to the embodiments described above with reference to the drawings, and may include the following various embodiments within the technical scope of the present invention.

(1) In the first embodiment, an example of the pair of thin-film capacitors 30 being formed facing both sides of the center pad region 14 is described, but this is not a limitation.

For example, the thin-film capacitors 30 may be formed facing only one side of the center pad region 14. Alternatively, two pairs of thin-film capacitors 30 may be formed facing both sides of the center pad region 14. The manner in which the thin-film capacitor group 30G is formed (divided) is not limited to the manners illustrated in FIGS. 6 and 7. The thin-film capacitor group 30G may be divided as needed in accordance with the required form of the thin-film capacitor.

(2) In the fourth embodiment, the heat spreader 45 may be omitted. Conversely, in the fifth embodiment, a heat-dissipating member such as the heat spreader 45 may be provided on the back surface 12 of the memory chip 10.

EXPLANATION OF SYMBOLS

1: Semiconductor memory device, 10: Memory chip, 11: Circuit surface, 13: Center pad, 14: Center pad region, 20: Intermediate substrate, 21: First insulating layer, 22: Second insulating layer, 23: Transmission line, 24, 25: Au wire, 26: Soldering bump, 27: Protection layer, 30: Thin-film capacitor, 31: First plane electrode, 31Gin: First power supply input portion, 31Gout: First power supply output portion, 32: Second plane electrode, 32Vin: Second power supply input portion, 32Vout: Second power supply output portion, 33: Thin-film dielectric layer, 40: Intermediate substrate, 45: Heat spreader, 46: Heat-dissipating plate, 47: Heat-transmitting portion, 48: Thin-wall portion

The invention claimed is:

1. A semiconductor memory device provided with a memory chip including a circuit surface having a center pad region with a plurality of center pads formed therein, and a back surface on a side opposite from the circuit surface, the semiconductor memory device comprising:
   a thin-film capacitor disposed at a position facing the circuit surface except for the center pad region; and
   a first insulating layer formed on a side opposite from the memory chip with respect to the thin-film capacitor, the first insulating layer having a transmission line formed thereon, wherein
   the thin-film capacitor includes:
   a first plane electrode including a first power supply input portion to which a power supply voltage of one polarity to the memory chip is supplied, and a first power supply output portion disposed near the center pad region to output the supplied power supply voltage of one polarity to the center pads;
   a thin-film dielectric layer of a paraelectric material or a ferroelectric material formed on the first plane electrode except for the first power supply input portion and the first power supply output portion; and
   a second plane electrode formed on the thin-film dielectric layer and including a second power supply input portion to which a power supply voltage of another polarity to the memory chip is supplied and a second power supply output portion disposed near the center pad region to apply the supplied power supply voltage of the other polarity to the center pads, and
   the transmission line includes a signal input portion to which a signal to the memory chip is supplied, and a signal output portion disposed near the center pad region to supply the supplied signal to the center pads.

2. The semiconductor memory device according to claim 1, comprising:
   a substrate on which the memory chip is mounted face-up; and
   a second insulating layer formed on the circuit surface of the memory chip, wherein
   the first plane electrode of the thin-film capacitor is formed on the second insulating layer,
   the first insulating layer is formed on the second plane electrode except for the second power supply input portion and the second power supply output portion,
   the substrate includes a plurality of connecting pads connected to the first power supply input portion, the second power supply input portion, and the signal input portion,
   the first power supply input portion, the second power supply input portion, and the signal input portion are connected to the plurality of connecting pads by wire bonding, and
   the first power supply output portion, the second power supply output portion, and the signal output portion are connected to the plurality of center pads by wire bonding.

3. The semiconductor memory device according to claim 1, comprising
   a second insulating layer formed on the circuit surface of the memory chip, wherein
   the first plane electrode of the thin-film capacitor is formed on the second insulating layer,
   the first insulating layer is formed on the second plane electrode except for the second power supply input portion and the second power supply output portion,
   the first power supply input portion and the second power supply input portion include a first connecting bump,
   the signal input portion includes a second connecting bump having a height smaller than the first connecting bump by a thickness of the first insulating layer, and
   the first power supply output portion, the second power supply output portion, and the signal output portion are connected to the plurality of center pads by wire bonding.

4. The semiconductor memory device according to claim 1, comprising:
   a metal plate on which the memory chip is mounted face-up;
   a substrate on which the metal plate is disposed;
   a second insulating layer formed on the circuit surface of the memory chip; and
   a protection layer formed on the first insulating layer, wherein
   the first plane electrode of the thin-film capacitor is formed on the second insulating layer,
   the first insulating layer is formed on the second plane electrode except for the second power supply input portion and the second power supply output portion,
   the substrate includes a plurality of connecting pads connected to the first power supply input portion, the second power supply input portion, and the signal input portion,
   the first power supply input portion, the second power supply input portion, and the signal input portion are connected to the plurality of connecting pads by wire bonding,
   the first power supply output portion, the second power supply output portion, and the signal output portion are connected to the plurality of center pads by wire bonding, and
   the substrate, the memory chip, the second insulating layer, the thin-film capacitor, the first insulating layer, and the protection layer are stacked in this order to form a storage unit,
   the semiconductor memory device comprises at least two tiers of the stacked storage units, and a heat-dissipating member disposed on the protection layer of the uppermost-tier storage unit and thermally connected to each metal plate.

5. The semiconductor memory device according to claim 4, wherein the metal plate has a rectangular shape having a length smaller than a length of the memory chip in a direction along a wire-laid direction for the wire bonding in a planar view, and a length greater than the length of the memory chip in a direction orthogonal to the wire-laid direction in a planar view, and the metal plate disposed on the lowermost-tier substrate includes a heat-transmitting portion disposed at an end in a longitudinal direction of the metal plate and thermally connected to the metal plate disposed on the substrate of an upper tier than the lowermost-tier and to the heat-dissipating member.

6. The semiconductor memory device according to claim 5, wherein the substrate is provided with an opening or a thin-wall portion for disposing the metal plate.

7. The semiconductor memory device according to claim 1, comprising:

a substrate on which the memory chip is mounted face-down;

a protection layer formed on the transmission line; and a second insulating layer disposed on the circuit surface of the memory chip, wherein the first plane electrode of the thin-film capacitor is formed on the second insulating layer, the first insulating layer on a center pad side is formed on the thin-film capacitor with the first power supply output portion and the second power supply output portion being exposed, while the first insulating layer on an opposite side from the center pad side is etched back such that the signal input portion is exposed on the protection layer, the second insulating layer on the opposite side from the center pad side is etched back such that the first power supply input portion and the second power supply input portion are exposed on the first insulating layer, the protection layer on the center pad side is formed such that the signal output portion is exposed on the second insulating layer, while the protection layer on the opposite side from the center pad side is formed such that the signal input portion is exposed thereon, the first power supply output portion, the second power supply output portion, and the signal output portion are connected to the plurality of center pads by wire bonding, the second insulating layer, the thin-film capacitor, the first insulating layer, the transmission line, and the protection layer that are formed on the circuit surface of the memory chip are mounted on the substrate to be vertically inverted such that the memory chip is provided as the uppermost-layer and the protection layer is provided as the lowermost-layer, the substrate includes a plurality of connecting pads connected to the first power supply input portion, the second power supply input portion, and the signal input portion, and the first power supply input portion, the second power supply input portion, and the signal input portion are connected to the plurality of connecting pads by wire bonding.

8. The semiconductor memory device according to claim 1, comprising:

a substrate;

the first insulating layer formed on the substrate;

a second insulating layer formed on the first insulating layer; and a protection film formed on the thin-film capacitor, wherein the memory chip is mounted face-down on the protection film, the second insulating layer is formed on the first insulating layer except for the signal input portion of the transmission line, the first plane electrode of the thin-film capacitor is formed on the second insulating layer, the first power supply output portion includes first power supply output wiring formed on the second insulating layer, the second power supply output portion includes second power supply output wiring formed on the second insulating layer, the signal output portion of the transmission line includes a via formed in the second insulating layer, and signal output wiring connected to the via and formed on the second insulating layer, the substrate includes a plurality of connecting pads connected to the first power supply input portion, the second power supply input portion, and the signal input portion, the first power supply input portion, the second power supply input portion, and the signal input portion are connected to the plurality of connecting pads by wire bonding, and the first power supply output wiring, the second power supply output wiring, and the signal output wiring are connected to the plurality of center pads by a bump.

9. The semiconductor memory device according to claim 7, comprising a heat-dissipating member disposed on the back surface of the memory chip.

10. The semiconductor memory device according to claim 1, comprising at least a pair of the thin-film capacitors formed on both sides of the center pad region.

11. The semiconductor memory device according to claim 1, wherein the second plane electrode is divided into a plurality of portions in a region corresponding to the first plane electrode in a planar view.

* * * * *